US007189077B1

(12) United States Patent
Eldridge et al.

(10) Patent No.: US 7,189,077 B1
(45) Date of Patent: Mar. 13, 2007

(54) LITHOGRAPHIC TYPE MICROELECTRONIC SPRING STRUCTURES WITH IMPROVED CONTOURS

(75) Inventors: Benjamin N. Eldridge, Danville, CA (US); Stuart W. Wenzel, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/710,539

(22) Filed: Nov. 9, 2000

Related U.S. Application Data

(63) Continuation-in-part of application No. 09/364,788, filed on Jul. 30, 1999.

(51) Int. Cl.
*H01R 12/10* (2006.01)

(52) U.S. Cl. .......................... 439/66; 439/862

(58) Field of Classification Search ............ 439/66–83, 439/591, 876, 885–887, 862; 200/245, 246, 200/250, 275, 292, 282; 361/772, 774, 776; 29/852, 854, 876, 884

See application file for complete search history.

(56) References Cited

U.S. PATENT DOCUMENTS 3,173,737 A * 3/1965 Kinkaid et al. ............. 439/709
3,519,890 A    7/1970 Ashby (Continued)

FOREIGN PATENT DOCUMENTS

EP            632281        1/1995

(Continued)

OTHER PUBLICATIONS

U.S. Appl. No. 09/032,473, filed Feb. 26, 1998, Pedersen et al.

(Continued)

*Primary Examiner*—Renee Luebke
*Assistant Examiner*—Larisa Tsukerman
(74) *Attorney, Agent, or Firm*—N. Kenneth Burraston

(57) ABSTRACT

Improved lithographic type microelectronic spring structures and methods are disclosed, for providing improved tip height over a substrate, an improved elastic range, increased strength and reliability, and increased spring rates. The improved structures are suitable for being formed from a single integrated layer (or series of layers) deposited over a molded sacrificial substrate, thus avoiding multiple stepped lithographic layers and reducing manufacturing costs. In particular, lithographic structures that are contoured in the z-direction are disclosed, for achieving the foregoing improvements. For example, structures having a U-shaped cross-section, a V-shaped cross-section, and/or one or more ribs running along a length of the spring are disclosed. The present invention additionally provides a lithographic type spring contact that is corrugated to increase its effective length and elastic range and to reduce its footprint over a substrate, and springs which are contoured in plan view. The present invention further provides combination (both series and parallel) electrical contacts tips for lithographic type microelectronic spring structures. The microelectronic spring structures according to the present invention are particularly useful for making very fine pitch arrays of electrical connectors for use with integrated circuits and other substrate-mounted electronic devices, because their performance characteristics are enhanced, while at the same time, they may be manufactured at greatly reduced costs compared to other lithographic type microelectronic spring structures.

88 Claims, 10 Drawing Sheets

U.S. PATENT DOCUMENTS

| | | | |
|---|---|---|---|
| 3,707,071 A * | 12/1972 | Walton | 368/159 |
| 3,842,189 A | 10/1974 | Southgate | |
| 4,017,143 A * | 4/1977 | Knowles | 439/873 |
| 4,553,192 A | 11/1985 | Babuka et al. | |
| 4,615,573 A | 10/1986 | White et al. | |
| 4,772,228 A * | 9/1988 | Seymour | 439/637 |
| 4,893,172 A | 1/1990 | Matsumoto et al. | |
| H842 H | 11/1990 | Ochs | |
| 5,152,695 A * | 10/1992 | Grabbe et al. | 439/71 |
| 5,173,055 A * | 12/1992 | Grabbe | 439/66 |
| 5,210,939 A | 5/1993 | Mallik et al. | |
| 5,228,861 A * | 7/1993 | Grabbe | 439/66 |
| 5,272,913 A | 12/1993 | Toda et al. | |
| 5,286,208 A | 2/1994 | Matsuoka | |
| 5,462,440 A * | 10/1995 | Rothenberger | 439/66 |
| 5,513,430 A | 5/1996 | Yanof et al. | |
| 5,534,784 A | 7/1996 | Lum et al. | |
| 5,555,422 A | 9/1996 | Nakano | |
| 5,576,630 A | 11/1996 | Fujita | |
| 5,599,194 A | 2/1997 | Ozawa et al. | |
| 5,613,861 A * | 3/1997 | Smith et al. | 439/81 |
| 5,632,631 A * | 5/1997 | Fjelstad et al. | 439/82 |
| 5,666,190 A | 9/1997 | Quate et al. | |
| 5,701,085 A | 12/1997 | Malladi et al. | |
| 5,810,609 A | 9/1998 | Faraci et al. | |
| 5,821,763 A | 10/1998 | Beaman et al. | |
| 5,829,128 A | 11/1998 | Eldridge et al. | |
| 5,914,614 A | 6/1999 | Beaman et al. | |
| 5,944,537 A * | 8/1999 | Smith et al. | 439/81 |
| 5,974,662 A * | 11/1999 | Eldridge et al. | 29/842 |
| 5,994,152 A | 11/1999 | Khandros et al. | |
| 6,014,032 A | 1/2000 | Maddix et al. | |
| 6,016,061 A | 1/2000 | Mizuta | |
| 6,029,344 A | 2/2000 | Khandros et al. | |
| 6,031,282 A | 2/2000 | Jones et al. | |
| 6,059,982 A | 5/2000 | Palagonia et al. | |
| 6,064,213 A | 5/2000 | Khandros et al. | |
| 6,072,190 A | 6/2000 | Watanabe et al. | |
| 6,113,440 A * | 9/2000 | Fijten et al. | 439/862 |
| 6,183,267 B1 | 2/2001 | Marcus et al. | |
| 6,184,053 B1 | 2/2001 | Eldridge et al. | |
| 6,184,576 B1 | 2/2001 | Jones et al. | |
| 6,214,631 B1 | 4/2001 | Burrows et al. | |
| 6,250,933 B1 | 6/2001 | Khoury et al. | |
| 6,255,126 B1 | 7/2001 | Mathieu et al. | |
| 6,255,727 B1 | 7/2001 | Khoury | |
| 6,289,583 B1 | 9/2001 | Belmont et al. | |
| 6,307,392 B1 | 10/2001 | Soejima et al. | |
| 6,309,262 B1 * | 10/2001 | Morris | 439/862 |
| 6,344,752 B1 | 2/2002 | Hagihara et al. | |
| 6,359,455 B1 | 3/2002 | Takekoshi | |
| 6,361,331 B2 * | 3/2002 | Fork et al. | 439/81 |
| 6,452,407 B2 | 9/2002 | Khoury et al. | |
| 6,497,581 B2 * | 12/2002 | Slocum et al. | 439/66 |
| 6,538,214 B2 * | 3/2003 | Khandros | 174/267 |
| 6,713,374 B2 | 3/2004 | Eldridge et al. | |
| 2001/0012739 A1 * | 8/2001 | Grube et al. | 439/862 |
| 2001/0044225 A1 | 11/2001 | Eldridge et al. | |
| 2002/0055282 A1 | 5/2002 | Eldridge et al. | |
| 2003/0099737 A1 | 5/2003 | Eldridge et al. | |
| 2004/0142583 A1 * | 7/2004 | Mathieu et al. | 439/66 |

FOREIGN PATENT DOCUMENTS

| | | |
|---|---|---|
| EP | 0899538 A1 | 3/1999 |
| JP | 58-191453 | 11/1983 |
| JP | 63-062343 | 3/1988 |
| JP | 04-060410 | 2/1992 |
| JP | 04-231811 | 8/1992 |
| JP | 05-18741 | 1/1993 |
| JP | 05-198716 | 8/1993 |
| JP | 06-267408 | 9/1994 |
| JP | 07-21968 | 1/1995 |
| JP | 07333232 | 12/1995 |
| JP | 08-306708 | 11/1996 |
| TW | 341747 | 10/1998 |
| TW | 408408 | 10/2000 |
| WO | WO 91/12706 | 8/1991 |
| WO | WO 96/16440 | 5/1996 |
| WO | WO 97/44676 | 11/1997 |
| WO | WO 98/21597 | 5/1998 |
| WO | WO 98/52224 | 11/1998 |
| WO | WO 99/38229 | 7/1999 |
| WO | WO 00/33089 | 6/2000 |
| WO | WO 00/33096 | 6/2000 |
| WO | WO 01/9952 | 2/2001 |

OTHER PUBLICATIONS

U.S. Appl. No. 09/539,287, filed Sep. 30, 2000, Pedersen et al.

U.S. Appl. No. 09/364,788, filed Jul. 30, 1999, Eldridge et al.

U.S. Appl. No. 09/364,855, filed Jul. 30, 1999, Eldridge et al.

"A New Wafer Probe Interface Technology Using Compliant Microsprings, A Joint Study by Teradyne, Inc. and FormFactor, Inc.," Teradyne Formfactor White Paper (Teradyne, Inc. and FormFactor, Inc., Jan. 30, 1998), pp. 1-18.

Novitsky et al., "FormFactor Introduces An Integrated Process For Wafer-Level Packaging, Burn-in Testing, And Module Level Assembly" (FormFactor, Inc., Mar. 1999), 6 pages.

Khandros et al., "New Methods For Reducing Costs In Semiconductor Back-End," (FormFactor, Inc., Jan. 30, 1998), 9 pages.

\* cited by examiner

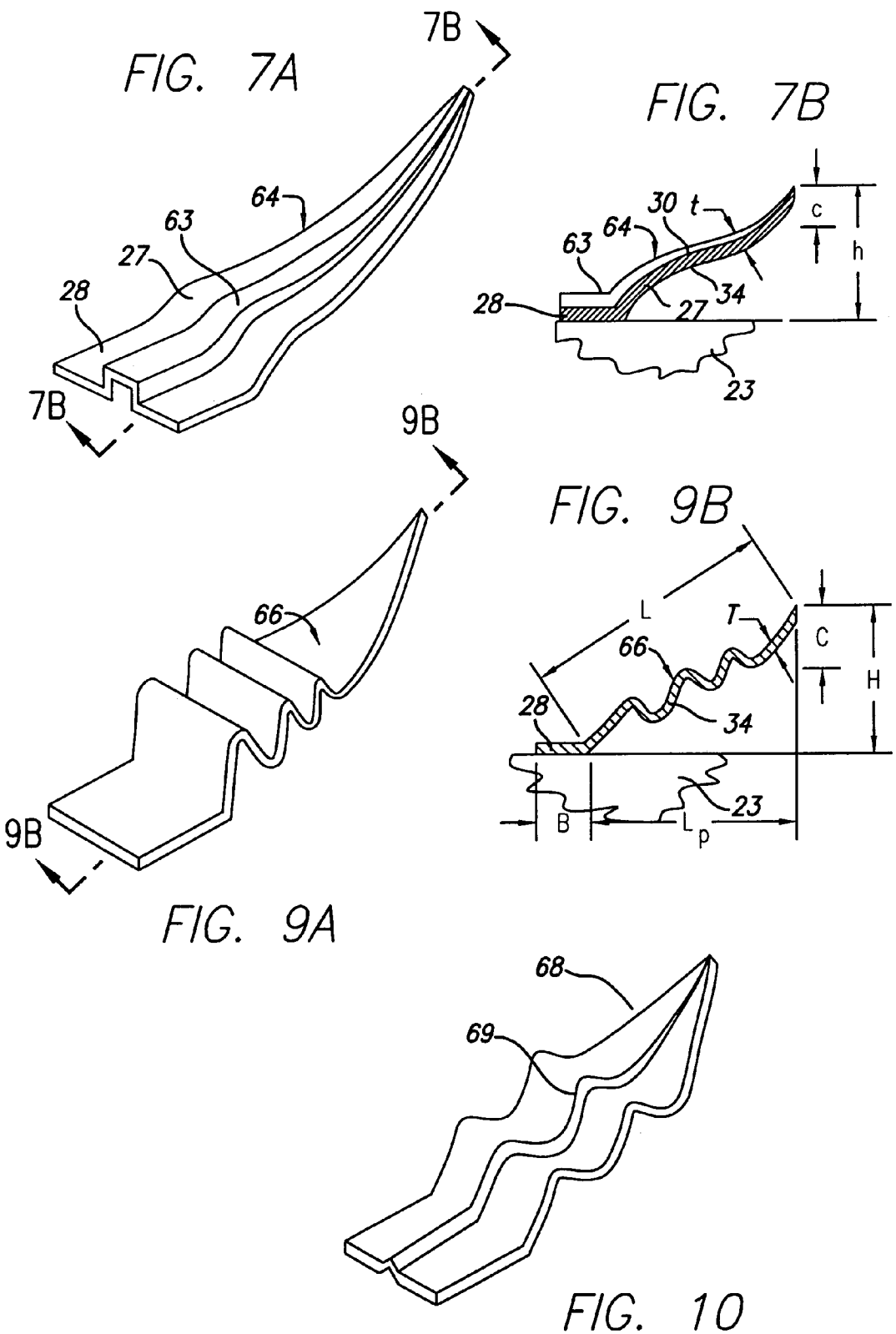

LITHOGRAPHIC TYPE MICROELECTRONIC SPRING STRUCTURES WITH IMPROVED CONTOURS

RELATED APPLICATION

This application is a continuation-in-part of co-pending application Ser. No. 09/364,788, filed Jul. 30, 1999, entitled "INTERCONNECT ASSEMBLIES AND METHODS," by Eldridge and Mathieu, which is incorporated by reference herein.

BACKGROUND OF THE INVENTION

1. Field of the Invention

The present invention relates to electrical contact elements for electrical devices, and more particularly to lithographic type, microelectronic spring contacts with improved contours.

2. Description of Related Art

Recent technological advances, such as described in U.S. Pat. No. 5,917,707 to Khandros et al., have provided small, flexible and resilient microelectronic spring contacts for mounting directly to substrates, such as semiconductor chips. The '707 patent discloses microelectronic spring contacts that are made using a wire bonding process that involves bonding a very fine wire to a substrate, and subsequent electro-plating of the wire to form a resilient element. These microelectronic contacts have provided substantial advantages in applications such as back-end wafer processing, and particularly for use as contact structures for probe cards, where they have replaced fine tungsten wires. It is further recognized, as described, for example, in U.S. Pat. Nos. 6,032,356 and 5,983,493 to Eldridge et al, that such substrate-mounted, microelectronic spring contacts can offer substantial advantages for making electrical connections between semiconductor devices in general, and in particular, for the purpose of performing wafer-level test and burn-in processes. Indeed, fine-pitch spring contacts offer potential advantages for any application where arrays of reliable electronic connectors are required, including for making both temporary and permanent electrical connections in almost every type of electronic device.

In practice, however, the cost of fabricating fine-pitch spring contacts has limited their range of applicability to less cost-sensitive applications. Much of the fabrication cost is associated with manufacturing equipment and process time. Contacts as described in the aforementioned patents are fabricated in a serial process (i.e., one at a time) that can not be readily converted into a parallel, many-at-a-time process. Thus, new types of contact structures, referred to herein as lithographic type microelectronic spring (or contact, or spring contact) structures, have been developed, using lithographic manufacturing processes that are well suited for producing multiple spring structures in parallel, thereby greatly reducing the cost associated with each contact. Exemplary lithographic type spring contacts, and processes for making them, are described in the commonly owned, co-pending U.S. Patent Applications "LITHOGRAPHICALLY DEFINED MICROELECTRONIC CONTACT STRUCTURES, Ser. No. 09/032,473 filed Feb. 26, 1998 by Pedersen and Khandros, and "MICROELECTRONIC CONTACT STRUCTURES", Ser. No. 60/073,679, filed Feb. 4, 1998 by Pedersen and Khandros, both of which are incorporated herein by reference.

Lithographic type microelectronic spring contacts are subject to different design considerations than the plated and bonded wire microelectronic contacts currently in use, because of the characteristics of the lithographic manufacturing process. For example, lithographic type contacts are typically much smaller than wire-type microelectronic contacts, and tend to have characteristic cross-sections of relatively low-aspect ratio (i.e., flat) shape, in contrast to the circular or elliptical cross-sections typical for wire contacts. Because of their typical structural shape, lithographic type springs with essentially flat, rectangular cross-sections typically have relatively low stiffness (spring rates) and relatively small elastic ranges (that is, they may be deflected for only a short distance before becoming permanently deformed). Consequently, it is difficult to achieve the desired contact force needed to make a reliable electrical contact at the contact tip, without exceeding the elastic range of the spring, and thereby potentially damaging it.

Additionally, lithographically-defined contacts typically have a proportionally small "z-component," that is, they may extend away from the substrate in a perpendicular ("z") direction proportionally less than wire-type microelectronic contacts. This also limits the elastic range of the spring, because the contact force is typically applied in the z direction. One approach for providing adequate z-extension, for example, as disclosed in the above-referenced U.S. patent application Ser. Nos. 09/032,473 and 60/073,679, is to fabricate the spring structures using a series of lithographic steps, thereby building up the z-component extension with several lithographic layers. However, the use of multiple layers adds undesirable cost and complexity to the manufacturing process. Layered structures are also subject to undesirable stress concentration and stress corrosion cracking, because of the discontinuities (i.e., stepped structures) that result from layering processes.

Microelectronic spring structures are preferably provided with ample z-extension to permit mounting components, such as capacitors, below the structure. Adequate z-extension, together with adequate elastic range, is also desirable for reducing the amount of vertical positioning precision needed to make an electrical connection using the spring structure. Adequate stiffness is desired to ensure that the tip of the contact is applied to its electrical contact pad with sufficient force to ensure that a reliable electrical connection is made. Finally, improved strength and crack resistance is desirable for increasing the reliability and service life of the spring structure. The typical characteristics of very small feature size, relatively flat rectangular cross-section, and less z-component extension in proportion to spring length, make it very difficult to fabricate lithographically defined spring structures with adequate strength, stiffness, elastic range, and z-extension, to serve as reliable microelectronic spring contact structures.

A need therefore exists for an improved, lithographic type, microelectronic spring structure with improved spring characteristics, such as improved strength, stiffness, resistance to stress concentration cracking, and elastic range. A need further exists for an improved lithographic type microelectronic spring structure that can be fabricated in a single layer, thereby eliminating process layering steps and the associated costs. Furthermore, a need exists for an improved lithographic type microelectronic spring structure with greater z-component extension.

SUMMARY OF THE INVENTION

The present invention provides lithographically defined spring structures and methods to address the foregoing difficulties, while achieving adequate z-extension without requiring the use of multiple stepped lithographic layers. Lithographic type microelectronic spring contact structures are provided that are triangular in shape in plan view, low-aspect ratio rectangular in cross-section, and having z-component extension along a linear or curved slope. In particular, spring structures according to the present invention are suitable for being fabricated by depositing a layer of integrated spring material over a molded form, thereby greatly reducing the number of processing steps required. At the same time, the spring structures according to the present invention are contoured to provided numerous performance improvements. For example, structures having a U-shaped cross-section, a V-shaped cross-section, and/or a rib running along a length of the spring are provided. Such contouring provides spring structures with a higher stiffness and/or strength, thereby providing a higher spring force at the contact tip and/or working range for a given amount of spring material. The present invention additionally provides a lithographic type spring contact that is corrugated to increase its effective length and elastic range. Contouring of the spring structure according to the present invention further includes contouring in the plane of the substrate, to provide increased elastic range within a decreased footprint. The present invention further provides a variety of improved tips for making electrical contacts with lithographic type microelectronic spring structures.

A more complete understanding of the improved lithographic type microelectronic spring structures will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 7A is a perspective view of an exemplary contoured lithographic type microelectronic spring structure according to the present invention, having a longitudinal rib extending above the spring.

FIG. 7B is a cross-sectional view of the spring structure shown in FIG. 7A, taken along the line indicated by arrows 7B.

FIG. 9A is a perspective view of an exemplary contoured lithographic type microelectronic spring structure according to the present invention, having longitudinal corrugations.

FIG. 9B is a cross-sectional view of the spring structure shown in FIG. 9A, taken along the line indicated by arrows 9B.

FIG. 10 is a perspective view of an exemplary contoured lithographic type microelectronic spring structure according to the present invention, having a longitudinal rib extending above the spring, and longitudinal corrugations.

FIG. 12B is a plan view of the spring structure of FIG. 13A.

DETAILED DESCRIPTION OF THE PREFERRED EMBODIMENT

Figure 1A:
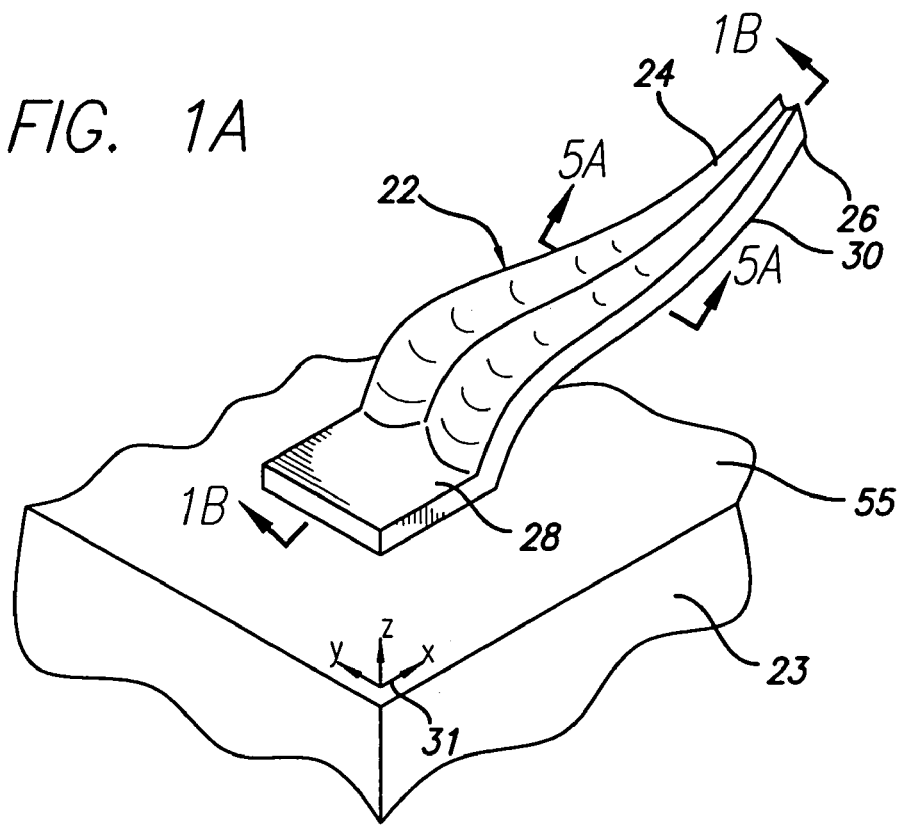
FIG. 1A is a perspective view of an exemplary contoured lithographic type microelectronic spring structure according to the present invention, having a V-shaped cross-section.

The present invention satisfies the need for microelectronic spring structure, that overcomes the limitations of prior art spring contacts. In the detailed description that follows, like element numerals are used to describe like elements illustrated in one or more figures. Various terms and acronyms are used throughout the detailed description, including the following:

"Area moment of inertia," sometimes denoted as "I," is a section property defined as the integral of the section area times the distance from the neutral bending axis squared, that is:

$$\int z^2 dA$$

where z is the distance from the neutral axis of bending and $dA$ is an element of the area being integrated. For example, for a rectangular cross-section having a width "w", a thickness "t," and a neutral axis through its centroid (½t) on the y-axis at z=0, the area moment of inertia is $wt^3/12$.

"Contour," when used as a verb, means to form a curved surface. When used as a noun, "contour" means a curved line defined by the intersection of a curved surface and a plane. A "contoured surface" means a formed, curved surface.

"Elastic deflection ratio" means the dimensionless ratio of the elastic range (placed in the numerator of the ratio) to the projected length of the undeflected spring in the same direction (placed in the denominator). For example, with respect to a vertical downward force applied to a cantilevered beam spring, the elastic deflection ration is the vertical elastic range "c" divided by the z-extension of the spring "h." Being dimensionless, it may be expressed as a percentage; for example, 10% is equivalent to a ratio of 0.1.

"Elastic range" means the maximum distance that a spring may be deflected in the direction of an applied force, before the spring is permanently deformed (which occurs when the yield strength of the spring is exceeded).

"Lithographic" refers to manufacturing processes used for making semiconductor devices by printing (or otherwise applying) thin layers of various materials in patterns on a substrate.

"Lithographic type" means having a shape suitable for making by a lithographic process. More precisely, a "lithographic type microelectronic spring structure" is one having a contoured sheet shape that is capable of being defined by deposition of a patterned material layer (typically, a layer of uniform thickness) on a substrate. Lithographic type contact structures are generally well suited for being fabricated at the same scale as the integrated circuits. For example, a lithographic type contact typically has a beam with its smallest dimension (thickness) not greater than about 50 microns, and more typically about 0.04 to 20 microns. The dimensional limit reflects a practical, rather than an inherent limit, of the lithographic process, and it is contemplated that lithographic type contact structures may be fabricated at larger scales for some applications.

"Spring rate" means a measure of spring stiffness, commonly expressed as k=F/δ, where k is the spring rate, F is the magnitude of a force applied to a working end of a spring, and δ is the distance that the spring is deflected in the direction of force F.

The foregoing definitions are not intended to limit the scope of the present invention, but rather are intended to clarify terms that are well understood by persons having ordinary skill in the art, and to introduce new terms helpful for describing the present invention. It should be appreciated that the defined terms may also have other meanings to such persons having ordinary skill in the art. These and other terms are used in the detailed description below.

Contact structures according to the present invention are particularly well-suited to making electrical connections to microelectronic devices having contact pads disposed at a fine-pitch, or where a large array of economical microelectronic spring contacts is desired. As used herein, the term "fine-pitch" refers to microelectronic devices that have their contact pads disposed at a spacing of less than about 130 microns (5 mils), such as 65 microns (2.5 mils). However, structures of the present invention may also be used in coarser-pitch applications, if desired. The advantages of the present invention are realized in part from the close tolerances and small sizes that can be realized by using lithographic rather than mechanical techniques to fabricate the contact elements. However, the use of lithographic techniques does not, by itself, result in effective and reliable contact structures disposed at a fine-pitch. Lithographic type, microelectronic spring contacts according to the structures and forms disclosed herein provide a greatly increased probability of success, and a greatly extended range of applications, compared to lithographic type springs having essentially linear beams with rectangular cross-sections.

Figure 1B:
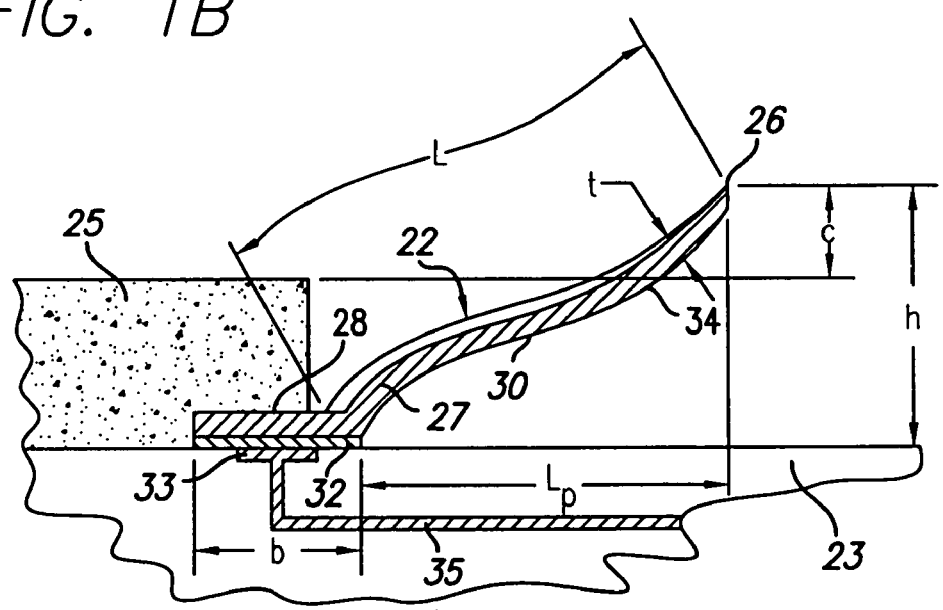
FIG. 1B is a cross-sectional view of the spring structure shown in FIG. 1A, taken along the line indicated by arrows 1B in FIG. 1A, additionally showing a stop structure disposed over the base of the spring.

Resilient contact structures, as known in the art, are subject to particular performance requirements, which vary in degree between applications. These requirements typically relate to contact force, wipe, clearance, contact angle, elastic range, z-extension, repeatability, and longevity. The contact structures according to the present invention provide advantages for each of the foregoing performance areas, as is made apparent by the description that follows. An exemplary microelectronic spring structure for providing such advantages is shown in FIGS. 1A and 1B. The cross-section shown in FIG. 1B is taken along the line indicated by arrows 1B in FIG. 1A. As indicated by arrows 31 and as used herein, the direction normal to substrate 23 is the z-axis direction; the direction parallel to the projected length of beam 30 onto substrate 23 is the x-axis direction; and the y-axis direction is normal to the plane defined by the z-axis and x-axis.

The microelectronic spring structure 22 of FIGS. 1A and 1B comprises a base 28 and a beam 30 integrally formed from at least one layer of electrically conductive, resilient material. Substrate 23 is typically a semiconductor substrate for an integrated circuit having numerous electrical terminals, one of which is shown as the contact pad 33 in FIG. 1A. Contact pads, such as contact pad 33, are typically coupled by conductive traces, such as trace 35, to internal circuitry within the integrated circuit. As known in the semiconductor art, substrate 23 is typically comprised of numerous layers, such as insulating layers interposed with conducting and semiconducting layers, and a passivating layer optionally provided on the top surface 55 of the substrate 23. The passivating layer may be an insulating layer or a polysilicon layer or other layers as known in the art. In some embodiments of the invention, a contact pad 33 is electrically and mechanically coupled to an intermediate conducting layer 32 which is disposed above it, as shown in FIG. 1A. When present, intermediate layer 32 is typically a manufacturing artifact of a shorting layer used during an electroplating step of a process for forming the microelectronic spring structure. A stop structure 25, as further described in the co-pending application Ser. No. 09/364,855, filed Jul. 30, 1999, entitled "INTERCONNECT ASSEMBLIES AND METHODS," by Eldridge and Mathieu, which is hereby incorporated herein by reference, is optionally provided to prevent over-compression of spring structure 22 by force "F." Spring structure 22 provides for conduction of electrical signals and/or power between a tip 26 of beam 30, through the beam 30 of resilient material, intermediate layer 32, and contact pad 33, and finally through conductive trace 35 to an integrated circuit in substrate 23. It should be appreciated that the microelectronic spring structure 22 of FIGS. 1A and 1B may also be used for other types of interconnect assemblies, such as probe card assemblies, interposers, and other connection systems where electrical contact to or through a substrate is desired.

Microelectronic contact structures according to the present invention are typically configured as a cantilevered beam, having a fixed base and a free tip, as described above. This basic geometry is preferred for lithographic type, microelectronic spring contact structures according to the invention for several reasons. Lithographic manufacturing processes, unlike alternative spring manufacturing processes such as wire forming, are best suited for making shapes that may be defined by projection onto a surface. Such shapes are capable of being formed in a single step of a lithographic process. In contrast, certain three dimensional curves, such as coils or helixes commonly found in wire-formed springs, cross over themselves and cannot be defined by projection onto a surface. Such shapes therefore require multiple lithographic steps to assemble, and cannot be made lithographically as a single, integrally formed piece. Coiled shapes are further undesirable because of electrical induction. Therefore, the cantilevered beam configuration is desirable for lithographic springs because fewer process steps are required, and the spring structure can be formed from an integrated mass of material. Also, the cantilevered beam, with a single attached base and a tip on the opposite end of a spring beam, is more nearly statically determinate, and thus is more easily modeled and tested than more complex configurations, such as springs with more than one base. Additionally, the cantilevered beam is capable of resilient motion in at least two dimensions, thereby providing both wipe (desirable for making an electrical connection) and z-deflection, for compensating for misalignment between substrates, and for providing the spring force needed for maintaining an electrical connection.

Figure 2:
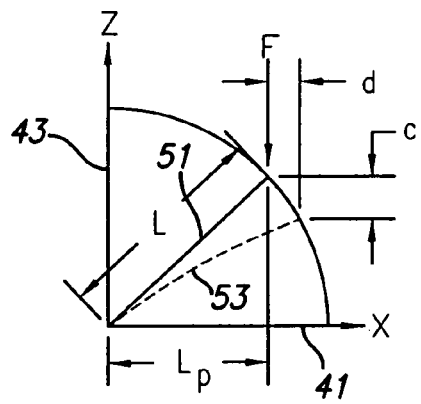
FIG. 2 is a diagram for illustrating various general concepts and characteristics applicable to spring structures.

Basic characteristics of linear cantilevered spring beams are illustrated by FIG. 2. Undeflected beam 51, of length "L," is fixed at x-axis 41 (representing a substrate surface). Beam 51 extends both vertically in the direction of z-axis 43, and horizontally along the substrate for a projected horizontal distance "$L_p$." A free tip of the beam is located a distance "h" from the substrate surface. When a vertical force "F" is applied to the free tip of beam (as by an approaching parallel substrate), the beam is deflected to the position indicated by dashed lines 53. Thus, the free tip of the beam moves a vertical distance "c" and a horizontal distance "d" (wipe). At the point at which further deflection will cause the beam material to yield and plastically deform (that is, at the elastic limit of beam 51), the vertical deflection "c" represents the elastic range relative to a vertical force "F." Thus, at the elastic limit, the ratio c/h is the elastic deflection ratio, beyond which deflection is inelastic. In a beam of constant cross-section, the point of maximum stress under application of force "F" is at the attached end of the beam, and the stress gradually lessens to a minimum value at the free tip.

Beam 51 is preferably tapered from a relatively wide width at its fixed base to a relatively narrow width at its tip, to compensate for stress distribution in the cantilevered beam. Such triangular-shaped beams are relatively more structurally "efficient" (capable of bearing a higher tip force "F" for a beam of given mass) than rectangular shaped beams of the same cross-sectional shape. However, a triangular shape may be less electrically efficient, because its current-carrying capacity is constrained by the relatively small beam cross-section at the tip of a triangular beam. Thus, for certain applications, beams of constant cross-section may be preferred. Spring beams according to the present invention may thus be tapered, and/or be provided with constant cross-sectional areas, depending on the requirements of the application.

In addition, Spring beams according to the present invention are preferably contoured across their width and along their length. Contouring along the length of the beam provides a more favorable deflected shape of the beam for purposes of making an electrical connection between two substrates, as described below with reference to FIG. 3. Contouring across the width of the beam provides cross-sectional shapes having higher area moments of inertia, compared to beams of the same mass having solid rectangular cross-sections. As is well understood in the structural arts, the stiffness of a beam of a given mass per unit length can be dramatically improved by altering its cross-sectional shape. For example, a box beam is much stiffer than a solid rectangular rod having the same mass per unit length. Heretofore, it has not been feasible to provide lithographic type contact structures with beams having higher area moments of inertia than provided by solid rectangular cross-sections. Also, there has been little or no motivation to reduce beam masses, because the cost of beam material for lithographic type beams is not significant. However, according to the present invention, it is highly desirable to reduce the mass of beam material in order to reduce the fabrication time required and the area occupied in a top down view of the structure, which determines the packing ability or minimum pitch at which the springs may be mounted to a surface.

The theories and mathematical tools for predicting the structural properties of a contoured spring structure are well known in the art. Computational tools, such as finite element methods, further make it possible to refine and optimize the shape of complex spring structures under complex loading conditions. Thus, using the contoured shapes according to the present invention, it is now possible to construct microelectronic spring structures using lithographic techniques that have a much wider range of performance properties than heretofore possible. In particular, the area moment of inertia, and thus the spring rate, can be greatly increased by contouring the beam across its width. Additionally, the spring shape can also be optimized to reduce stress concentration, resulting in more efficient use of material. Width-contoured springs can thus be made with much less material than required for flat cross-section microelectronic spring structures of a comparable spring rate and strength.

Reducing the amount of material required permits increased processing throughput by decreasing the time required for depositing a material. In addition, thin-layer deposition techniques that were previously considered too slow or costly for thick layers may be viable. For example, a flat spring design might require a material thickness of 25 microns (about 1 mil) to achieve a desired spring rate. Material of this thickness is typically deposited by electroplating, which is known for high throughput and cost-effectiveness in layers of this thickness. In contrast, a spring contoured according to the present invention can achieve the same spring rate using less material, for example, with only 5 microns (0.2 mils) of material thickness. If electroplating is used, the processing throughput would be about 5 times higher for the contoured spring. Additionally, CVD (chemical vapor deposition) and PVD (physical vapor deposition), typically limited to depositing layers up to about 5 microns thick, become viable alternative deposition methods for the spring metal.

Figure 5A:
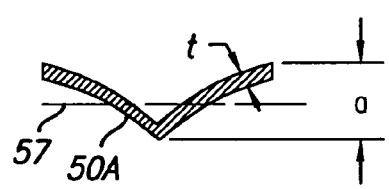
FIG. 5A shows a cross-sectional view, taken along the line indicated by arrows 5A in FIG. 1A, of an exemplary V-shaped spring structure according to the present invention.

Referring again to FIGS. 1A and 1B, contouring of spring beam 30 is visible in both views. Beam 30 is preferably contoured across its width, as is shown in FIG. 1B illustrating a V-shaped beam. An exemplary V-shaped cross-section of beam 30, having a constant thickness "t," is shown in more detail in FIG. 5A. It will be understood that an approximately constant thickness is a typical result of lithographic type deposition processes, such as electroplating, CVD, and PVD. From a comparison of the V-shape 50A shown in FIG. 5A to the flat rectangular cross-section 50C of equivalent thickness shown in FIG. 5C, it is evident that the V-shaped cross-section 50A has a substantially greater area moment of inertia, because the extension "a" of the shape across the neutral axis 57 is much greater. Thus, a V-shaped cross-section may be provided wherever the beam 30 is desired to be stiffened. In the case of beam 30 shown in FIG. 1A, the V-shape is provided along the entire length of beam 30. If desired, however, the contoured cross-sectional shape may be provided along only a portion of the beam length, or may be altered to provide varying beam stiffness along the length of beam 30. This may be desirable where a portion of the beam, for example, a tip portion, is designed to be relatively flexible compared to a different portion, for example, a base portion.

Figure 3:
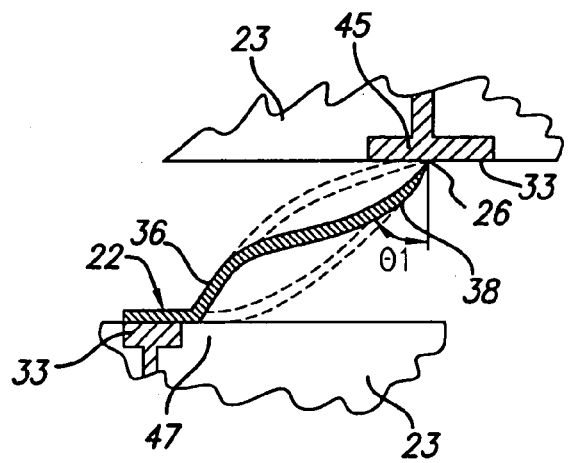
FIG. 3 is a side cross-sectional view of an exemplary spring structure according to the present invention while used for making an electrical connection between two substrates.

Additionally, beam 30 is preferably contoured lengthwise, as is illustrated by the curve 34, representing a curved line at a mid-plane of beam 30, visible in FIG. 1B. Beam 30 has a projected length "L"on substrate 23, which is less than an integrated beam length "L" from the juncture 27 with base 28 to tip 26. Tip 26 is located a vertical distance "h" from substrate 23 when the spring structure 22 is undeflected, and a distance "c" from the upper surface of stop structure 25. In an embodiment of the invention, beam 30 is preferably convex (as viewed from a viewpoint above spring structure 22 looking towards substrate 23) at a lower portion of the beam near base 28, and concave at an upper portion near tip 26. Thus, curve 30 is preferably a compound curve, and the entire beam 30 preferably follows approximately the same contour as curve 34. Advantages of the compound curve 34 are illustrated in FIG. 3, by way of comparison to a straight or convex beam, and to a concave beam. FIG. 3 shows a spring structure in compression between parallel substrates 23 and 23', for making electrical contact between contact pads 33 and 33'. Structure 22 is attached to substrate 23 at pad 33, and makes resilient contact with pad 33' on substrate 23. A typical position of a straight or convex beam under such compression between parallel substrates is shown by the dashed outline 37. When deflected by approaching parallel substrates 23 and 23', the straight or convex beam takes on an increasingly convex shape with a slope approaching that of surface 55' of substrate 23'. Thus, the tip contact tends to be spread out over a larger, less well-defined area 45, resulting in lower contact pressure, and a poorer electrical connection. Conversely, a concave beam, indicated by dashed outline 39, tends to approach the substrate 23 near the base of the spring structure 22 when under compression between parallel substrates. Under sufficient compression, a concave beam will contact substrate 23 in the vicinity of area 47, which may cause an electrical short circuit, an undesirable change in spring rate, and/or stress concentration in beam 30.

In contrast, the compound curve 34 of the present invention avoids these disadvantages of linear, convex, and concave beams in microelectronic contact applications. The concave upper portion 38 maintains the tip 26 of beam 30 inclined more perpendicularly relative to surface 55', thereby maintaining a well-defined contact area, high contact pressure, and good electrical contact with contact pad 33'. The convex lower portion 36 of beam 30 resists making contact with surface 55 of substrate 23, and tends to maintain a relatively constant minimum distance (step height "s") between beam 30 and substrate 23. The relatively constant step height "s," in addition to preventing short circuits, is useful for providing space for decoupling capacitors (not shown) having a height less than "s." Such decoupling capacitors can be mounted to either substrate 55 or 55'. In an embodiment of the invention, step height "s" is preferably about 10% of the total z-extension "h."

It should be noted that, for some applications, it is preferable to fabricate a separate tip structure and mount it to the tip portion 26 of beam 30. Separate tip structures are discussed below with reference to FIGS. 16A–16E. Separate tip structures have the disadvantage of requiring additional process steps to fabricate. When a separate tip structure is needed despite the added costs, the tip portion 26 of beam 30 may be formed with its upper surface roughly parallel to the surface of the mating substrate (as with a convex or essentially linear beam). However, even if a separate tip structure is to be used, it is still preferable that the upper portion 38 be mostly concave, to ensure that the beam does not contact the mating substrate when the tip is engaged in a contact pad of the mating substrate.

Prior to the present invention, it was not feasible to make lithographic type spring structures with the necessary degree of control over the shape of the spring contours for fabricating contoured spring structures. The present invention, however, provides a molding technique for fabricating contoured spring structures. An adaptation of this molding technique for making contoured spring structures according to the present invention is illustrated in FIGS. 4A–4H. The fabrication of a single contact structure will be described as exemplary of fabricating a plurality of such contact structures, preferably all at the same time on the same component. Typically, each of the contact structures fabricated on a single component will be substantially identical to one another. In the alternative, the dimensions and shape of each contact structure can individually be controlled and determined by the designer for given application requirements, and fabricated using the method described herein as will be apparent to one skilled in the art.

Figure 4A:
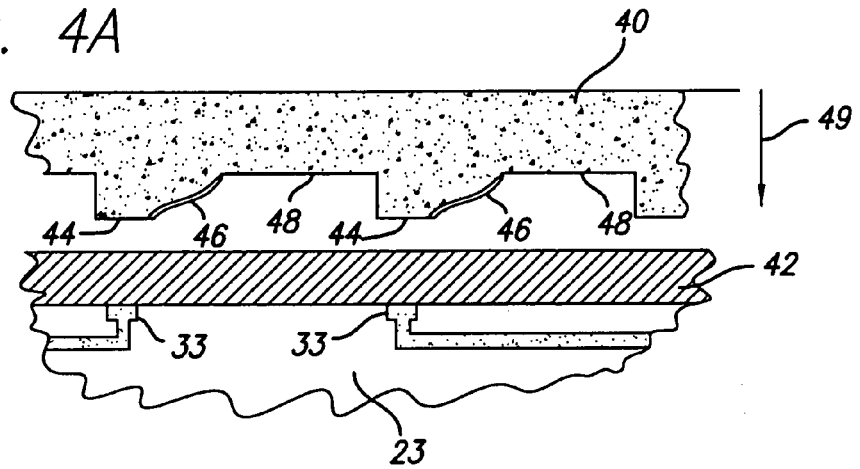
FIG. 4A is a side cross-sectional view of a process structure during an exemplary initial step of a process for making a lithographic type microelectronic spring structure according to the present invention.

Referring to FIG. 4A, in a preparatory step of a method for making a contoured spring, a substrate 23, optionally provided with a contact pads 33 for connecting to a integrated circuit, is coated with a moldable sacrificial layer 42. Sacrificial layer 42 may be any number of materials, such as PMMA (poly methyl methacrylate), which can be coated on a substrate to the desired thickness, which will deform when pressed with a mold or stamp, which will receive the resilient material to be deposited thereon, and which can then readily be removed without damaging the spring structures 22. Additional candidate materials for layer 42 include acrylic polymers, polycarbonate, polyurethane, ABS plastic, various photo-resist resins such as Novolac resins, epoxies and waxes. The sacrificial layer 42 preferably has a uniform thickness slightly greater than the desired z-extension "h" of the finished spring structures. For example, if the desired z-extension is 50 microns (about 2 mils), layer 42 may have a thickness of 55 microns (2.2 mils). Various methods known in the art, for example, spin coating and lamination, may be used to deposit layer 42 onto substrate 23.

Also, a stamping tool 40, having a molding face provided with different molding regions 44, 46, and 48, is prepared for molding sacrificial layer 42. Various methods may be used to prepare tool 40. For example, the stamping tool 40 may be formed from a relatively hard material using a computer controlled, laser ablation (micropulse) process as is known in the art.

Maximally protruding molding regions, or "teeth" 44 of tool 40 are used for deforming the sacrificial layer 42 in the area of the contact pads 33, where the bases 28 of contact structures 22 will be formed. Contoured molding regions 46 are used for deforming layer 42 where the contoured beams 30 of contact structures 22 will be formed. In FIG. 4A, a contoured region for making a V-shaped beam is shown in lengthwise cross-section. Maximally recessed molding regions 48 are used for receiving excess material, i.e., "flash," pushed aside by molding regions 44 and 46. Molding regions 48 also define spacing between adjacent spring structures 22 on substrate 23. Depending on the choice of materials for sacrificial layer 42 and stamping tool 40, a layer of mold release material (not shown) is optionally provided on the molding face of tool 40. It should be recognized that further layers and material may be present on substrate 23 without departing from the method described herein. For example, a metallic shorting layer (not shown) is optionally provided between layer 42 and substrate 23, to protect any integrated circuits embedded in the substrate during processing operations.

Figure 4B:
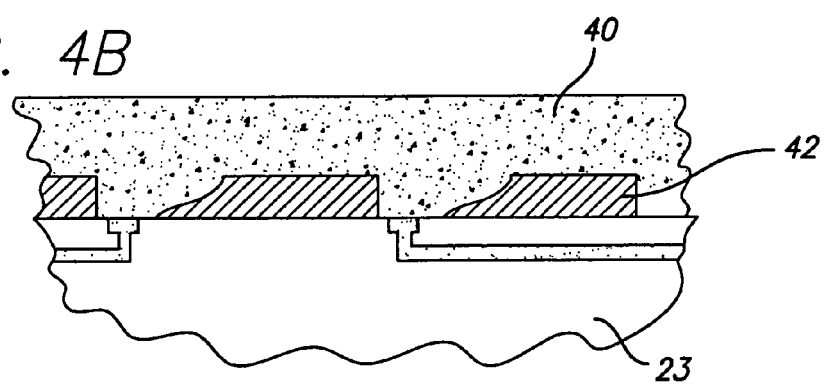
FIG. 4B similarly shows a process structure during an exemplary step following the step shown in FIG. 4A.

In a molding step illustrated in FIG. 4B, the stamping tool 40 is applied against substrate 23 with sufficient pressure to bring the teeth 44 nearly to the surface of substrate 23, and to fully mold layer 42 in all contoured molding regions 46. To avoid damaging substrate 23, teeth 44 are preferably not brought into contact with substrate 23. In a preferred embodiment, when teeth 44 have sunk into layer 42 to the desired depth, flash substantially fills the maximally recessed regions 48 to form a surface sufficiently uniform to permit later deposition of a layer of masking material between the spring structures after the stamping tool 40 is removed from layer 42. Stamping tool 40 may be heated to assist deformation of layer 42, and then cooled to harden layer 42 into place. In an alternative embodiment, layer 42 is selected of a material that is sufficiently deformable to flow under pressure without application of heat, and sufficiently viscous to hold its shape after tool 42 is removed. In yet another alternative embodiment, heat, UV light, or chemical catalysts are used to harden sacrificial layer 42 while under stamping tool 42, and then tool 42 is removed. Whatever molding technique is used, the cycle times are preferably relatively short to permit faster manufacturing throughput.

Figure 4C:
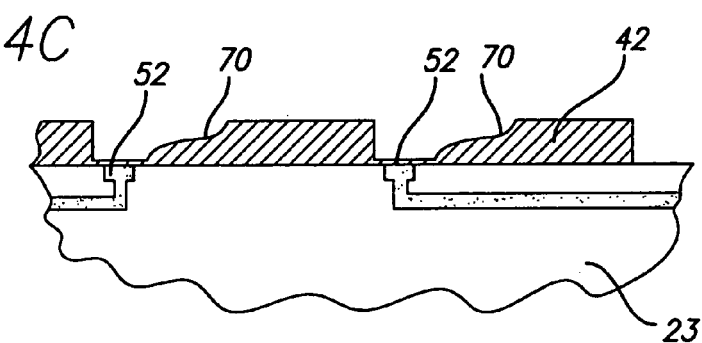
FIG. 4C similarly shows a process structure during an exemplary step following the step shown in FIG. 4B.

FIG. 4C shows the shape of the sacrificial layer 42 after removal of the stamping tool 42. A thin layer of residue 52 is present over the area of each contact pad 33. Negative mold surfaces 70 are also present, each bearing a negative impression of the desired contour for the contoured beams to be formed therein. It is necessary to remove the residue 52 in order to expose the substrate 23 in the areas where the bases 28 of the contact structures 22 will be formed. To remove the residue 52, the entire substrate with its molded layer 42 may be isotropically etched by immersion in a bath of etchants, by oxygen plasma, or other method as known in the art. Isotropic etching is suitable for relatively flat substrates for which the residue layer 52 is of a uniform thickness in all places where the spring bases 28 will be formed. Preferably, the isotropic etch is performed so as to remove the residue 52 while at the same time reducing the thickness of layer 42 to equal the desired z-extension of the finished spring structures 22. In the alternative, an anisotropic etching method that etches more rapidly in the z-direction, such as reactive ion etching, may be used. A z-anisotropic etch is preferably used in cases where the substrate is relatively uneven, causing non-uniformity in the thickness of residue 52.

Figure 4D:
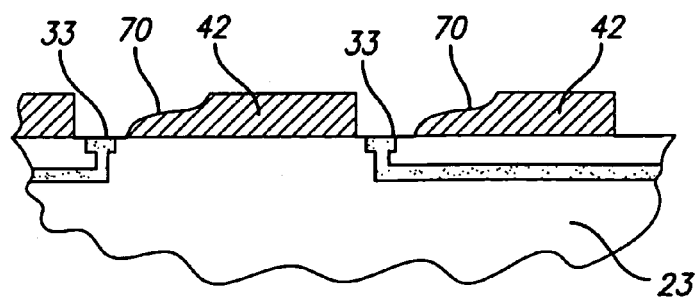
FIG. 4D similarly shows a process structure during an exemplary step following the step shown in FIG. 4C.

The appearance of the molded sacrificial layer 42 after etching is shown in FIG. 4D. The contact pads 33 are preferably exposed, along with a surrounding area of substrate 23 sufficient for providing adhesion of the base 28. In typical semiconductor applications, an exposed area of substrate 23 of between about 10,000 and about 40,000 square microns, most preferably in excess of about 30,000 square microns, is provided. After etching, the mold surfaces 70 preferably take on the desired contoured shape, and the distal tips of all mold surfaces 70 on substrate 23 are preferably within essentially the same plane.

Figure 4E:
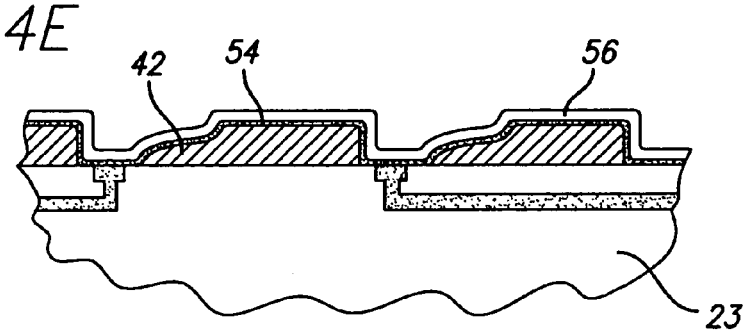
FIG. 4E similarly shows a process structure during an exemplary step following the step shown in FIG. 4D.
Figure 4F:
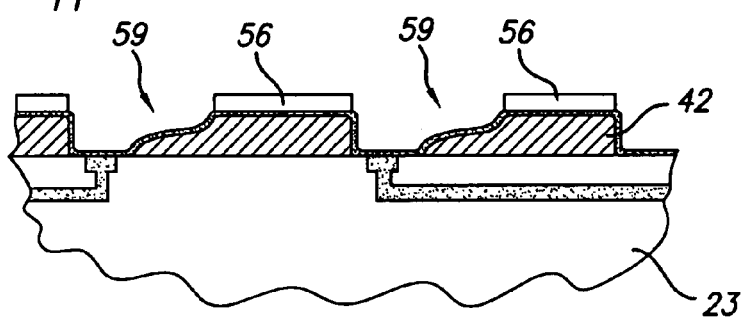
FIG. 4F similarly shows a process structure during an exemplary step following the step shown in FIG. 4E.

FIG. 4E shows substrate 23 after application of a seed layer 54 and a photo-resist layer 56. Seed layer 54 is typically a relatively thin layer, such as about 4500 Å (Angstroms; or about 0.45 microns) thick, of sputtered metal for electroplating the resilient spring material. In the alternative, surface modifications of layer 42, e.g. plasma treatment, may be used to render it conductive, thereby creating seed layer 54. In FIGS. 4E–4H, the relative thickness of seed layer 54 is greatly exaggerated. Photo-resist layer 56 may be selected from various commercially available resist materials, such as an electrodeposited resist, Novolac liquid resists, or a negative-acting dry film photo-resist. Photo-resist layer 56 is cured in an appropriate manner, for example by exposing the layer 56 to UV light through a mask, except where the spring structures 22 are to be formed. The uncured portions of photo-resist layer 56 are then dissolved away by a suitable solvent, as known in the art.

Figure 4G:
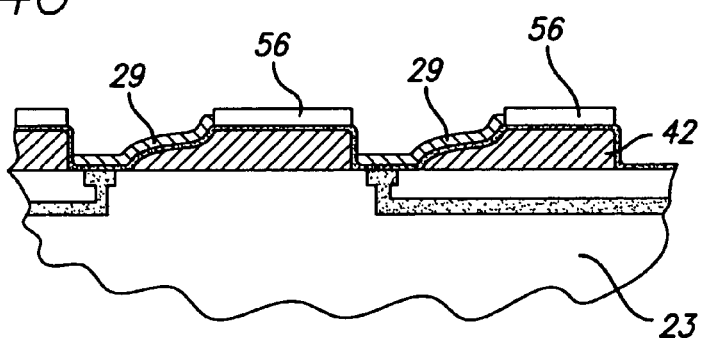
FIG. 4G similarly shows a process structure during an exemplary step following the step shown in FIG. 4F.
Figure 4H:
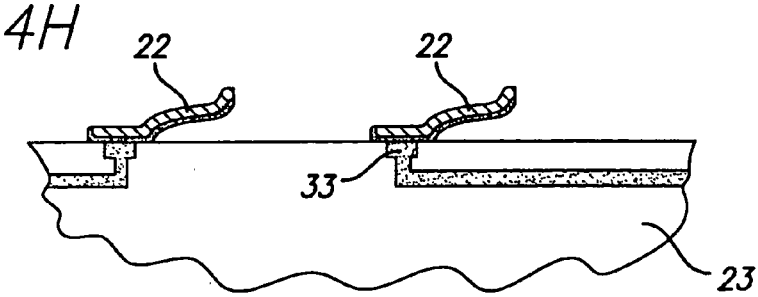
FIG. 4H similarly shows a process structure and resulting spring structures during an exemplary step following the step shown in FIG. 4G.

After the uncured portions of resist layer 56 are dissolved away, exposed areas 59 of seed layer are revealed, as shown in FIG. 4G. Exposed areas 59 have the projected shape of the desired microelectronic spring structure. For example, if a triangular beam is desired, the exposed area has a generally triangular shape, in plan view. One or more layers of resilient material may then be electroplated or otherwise deposited onto the seed layer in the exposed areas 59, using various methods as known in the art. Where the seed layer is covered by resist layer 56, no electroplating will occur. In the alternative, a layer of resilient material may be built up using a process such as CVD or PVD selectively applied to areas 59 through a mask, eliminating the need for seed layer 54. Thus, using any of various deposition methods, a spring structure comprising an integrally formed base and beam is formed on the exposed area 59, as shown in FIG. 4G. The cured resist layer 56, sacrificial material 42, and any residual seed layer 54, are then dissolved away using a suitable etchant that is relatively slow to etch the substrate 23 and the resilient material, as known in the art. Freestanding spring structures 22, as shown in FIG. 4H, are the result.

Suitable materials for the resilient material include but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; and tungsten, molybdenum and other refractory metals and their alloys. Use of nickel and nickel alloys is particularly preferred. In cases where a solder-like finish is desired, tin, lead, bismuth, indium, gallium and their alloys can also be used. The resilient material may further be comprised of more than one layer. For example, the resilient material may be comprised of two metal layers, wherein a first metal layer, such as nickel or an alloy thereof, is selected for its resiliency properties and a second metal layer, such as gold, is selected for its electrical conductivity properties. Additionally, layers of conductive and insulating materials may be deposited to form transmission line-like structures.

It should be recognized that numerous variations of the above-described sequence of steps will become apparent to one skilled in the art, for producing integrally formed spring structures according to the present invention. For example, a spring contact structure may be fabricated at an area on a substrate which is remote from a contact pad to which it is electrically connected. Generally, the spring contact structure may be mounted to a conductive line that extends from a contact pad of the substrate to a remote position. In this manner, a plurality of spring contact structures can be mounted to the substrate so that their tips are disposed in a pattern and at positions which are not dependent on the pattern of the contact pads on the substrate.

However, although various adaptations may be made to the method disclosed herein, in general, a molding or other forming process using a relatively thick layer of sacrificial material, such as layer 42, is preferred for providing adequate z-extension without requiring building up of multiple layers of photo-resist. Additionally, use of a deformable sacrificial material provides for duplication and mass production of relatively complex, contoured beam shapes.

Accordingly, in the preferred embodiments, the entire spring structure (with the exception of optional features such as separate tips) is definable in a layer of material deposited (such as by electroplating, CVD, or PVD) on the surface of a mold form. The resulting spring structures are thus comprised of an integral sheet, which may comprise a single layer, or multiple coextensive layers, of resilient, conductive, and/or resistive material. The integrated sheet may be folded and contoured, and is preferably essentially free of any overlapping portion in the direction that the materials are deposited (typically from above the structure towards a substrate), so it may be more readily formed by depositing a layer or layers of material in a single open mold, according to the process described above. A relatively small amount of overlap, particularly when the overlapping portions are well separated, may be achieved using some deposition methods, such as electroplating in conjunction with a "robber" to drive electrically charged material under an overhang.

The open molding process according to the present invention may be adapted to form contoured beams for spring structures in a wide variety of shapes and sizes. For the purpose of microelectronic spring contact structures, certain sizes and structural properties are preferred. A second, suitable range of sizes and relative properties, outside of the preferred range, may be readily achieved on electronic substrates using an open molding process according to the invention, but is less useful for typical electronic connection applications. A table of preferred and outside ranges is provided below in Table 1. It should be understood that the ranges stated in Table 1 should be helpful for constructing suitable microelectronic spring structures according to the invention, but should not be construed as strictly limiting the invention. Microelectronic spring contact structures with one or more dimensions or properties outside of a stated range may be constructed, without departing from the scope of the invention described herein. The symbols used in Table 1 are as presented in FIGS. 2 and 3.

TABLE 1

| Symbol | Description | Preferred Range | Suitable Range |
|---|---|---|---|
| L | Beam length, integrated from base to beam tip | 500–1000 µm (20–40 mils) | 15–10$^4$ µm (0.5–400 mils) |
| h | Height of beam tip over beam base | 100–300 µm (4–12 mils) | 10–7000 µm (0.4–300 mils) |
| t | Beam thickness | 10–30 µm (0.4–1.2 mils) | 0.1–500 µm (.04–20 mils) |
| w | Beam width (at widest point) | 130–500 µm (5–20 mils) | 5–2500 µm (0.2–100 mils) |
| α | Tip angle, relative to a normal vector of a mating substrate | 20–70° | 0–180° |
| β | Base angle, relative to the mounting substrate surface | 30–80° | 0–90° |
| k | Spring rate (vertical) | 30–250 mg/µm (1–6 g/mil) | 5–600 mg/µm (0.1–15 g/mil) |
| t/L | Ratio of beam thickness to length | .02–.06 | .01–0.4 |
| c/h | Elastic deflection ratio | 0.4–1.0 | 0.05–2.0 |
| L/L$_p$ | Ratio of beam length to beam span | 1–10 | 1–100 |

Figure 5B:
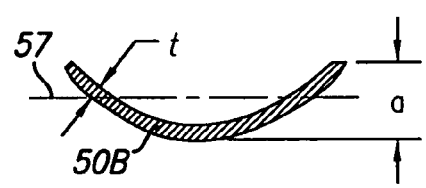
FIG. 5B shows a cross-section of an exemplary U-shaped spring structure according to the present invention, viewed similarly to FIG. 5A.
Figure 5C:
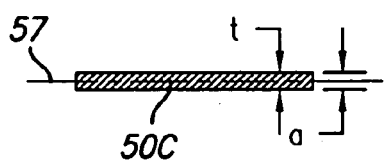
FIG. 5C shows a cross-section of an exemplary spring structure with a flat rectangular cross-section, viewed similarly to FIG. 5A.
Figure 6:
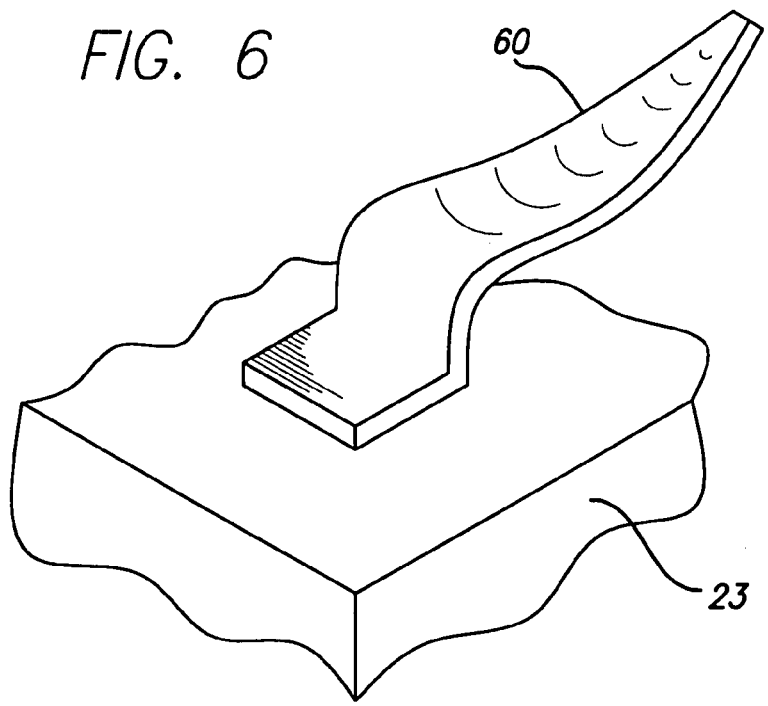
FIG. 6 is a perspective view of an exemplary contoured lithographic type microelectronic spring structure according to the present invention, having a U-shaped cross-section.

As previously described, the present invention provides for designing spring structures with specific properties, such as specific spring rates, by contouring the beam shape. FIGS. 6–10 show exemplary shapes for contoured beams according to the invention. An exemplary U-shaped beam is shown in FIG. 6. U-shaped beam 60 has a cross-section 50B as shown in FIG. 5B. Similarly to the V-shaped cross-section shown in FIG. 5A, the U-shaped cross-section 50B has a substantially higher area moment of inertia relative to a beam with a flat rectangular cross-section 50C, shown in FIG. 5C. The U-shaped cross-section avoids the notch in the base of the V-shape, which may cause undesirable stress concentration. However, the choice of a U-shaped cross-section relative to other sectional shapes depends mainly on considerations other than spring rate or other spring performance parameters. For example, manufacturability is an important consideration. Depending on the preferred manufacturing method, a particular shape, such as the U-shape, may be less costly to manufacture than other shapes.

Figure 8:
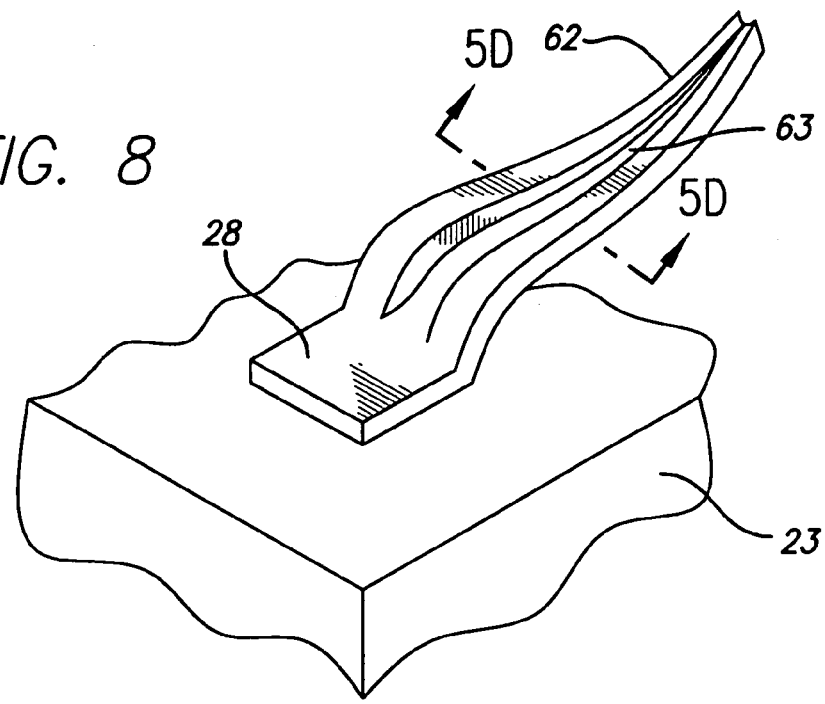
FIG. 8 is a perspective view of another exemplary contoured lithographic type microelectronic spring structure according to the present invention, having a longitudinal rib extending below the spring.

FIGS. 7A and 8 show various ribbed beams. FIG. 7A shows a contoured beam 64 having a rib 63 disposed above the surface of the beam. In beam 64, rib 63 runs the entire length of the beam and base 28. As shown in FIG. 7B, beam 64 is also preferably contoured lengthwise along a compound curve 34, as previously described. Rib 63 preferably follows the contour of curve 34, although it may be tapered in the z-direction to approach the upper surface of beam 64 at its tip. FIG. 8 shows a contoured beam 62 having a rib 63 disposed beneath the beam. Rib 63 is terminated at an edge of base 28. Ribbed beams may be somewhat more costly to fabricate than V-shaped or U-shaped beams, because of their more intricate shapes, but can provide certain advantages.

Figure 5D:
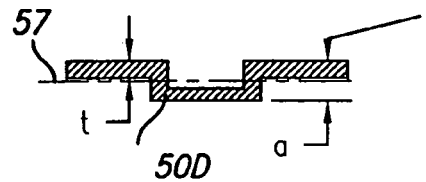
FIG. 5D shows a cross-section of an exemplary ribbed spring structure according to the present invention, viewed similarly to FIG. 5A.
Figures 13A, 13B:
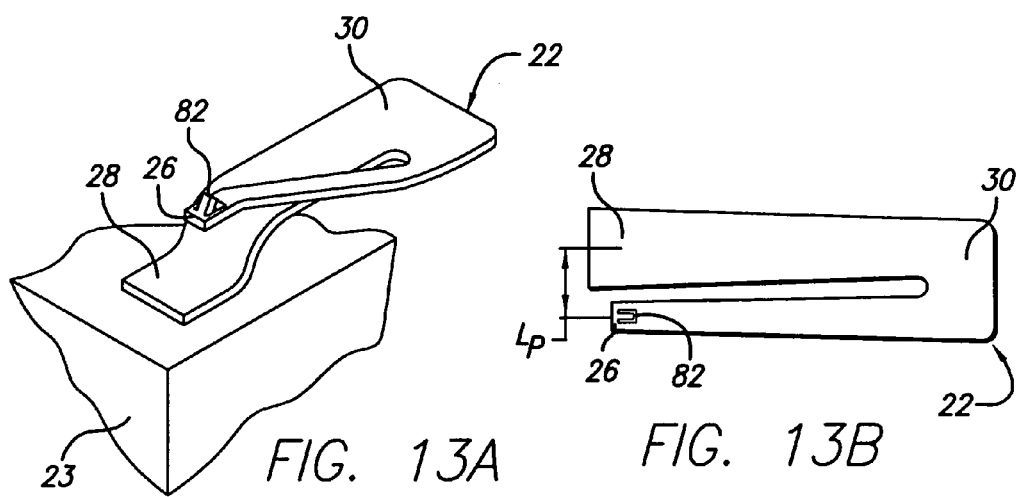
FIG. 13A is a perspective view of an alternative x-y folded design for a spring structure, without a split beam.

One advantage is that ribs can be placed across the width of a beam wherever greater stiffness is desired. For example, as shown in FIG. 5D, ribs may be placed on the edges of a beam to stiffen the beam against torsion. This may be desirable where a beam having an offset from a line between its base and its tip, such as the C-shaped beam shown in FIGS. 13A and 13B, is desired. Offset beams are subject to torsion in portions of the beam, and properly placed ribs can stiffen the offset beam against torsion, where desired. Another advantage is that a rib can be extended into the base of a microelectronic spring structure, as shown in FIGS. 7A and 7B. This prevents stress concentration and beam failure at the juncture 27 between base 28 and beam 30, that can result from abrupt changes in cross-sectional shape along a beam. Ribs 63 according to the present invention are preferably comprised of a folded portion of the beam 30, as shown in each of the foregoing FIGS. 5D and 7A–8. The folded portion is preferably configured so that no portion of the rib overlaps the beam, when viewed from above the beam looking towards the substrate. Non-overlapping, folded ribs may be formed by deposition of a layer of material over a molded form. Such ribs tend to have a hollow interior, as is evident in each of the foregoing FIGS. 5D and 7A–8. A folded rib thus has the same thickness "t" as the beam 30, and forms an integral portion of the beam. The cross-section of ribs may be rectangular, triangular, cylindrical, or another shape, and may taper in width or height along the length of the spring beam.

Contouring according to the present invention can be used for a completely different purpose, apart from providing an increased area moment of inertia for stiffening the spring, as described above. A spring may also be lengthwise contoured to decrease its "footprint," i.e., the amount of projected area the spring occupies on substrate 23. FIG. 9A shows a corrugated spring structure 66 that is contoured to decrease its footprint. An exemplary shape of the corrugations is shown in edge view in FIG. 9B. It should be apparent that the corrugations, like ribs, are readily formed by depositing a layer of material over a molded form, according to the method disclosed above. It should be further apparent that the ratio of the length "L" of the beam 30 to its projected length "$L_p$" on substrate 23 is increased by the corrugations. For a cantilevered beam springs having the same ratio of thickness to length (i.e., "the same t/L"), the elastic range is directly proportional to the spring length "L." Accordingly, the corrugations provide a greater elastic range "c" and a higher elastic deflection ratio ("c/h") than an uncorrugated beam of equivalent projected length and z-extension, so long as the thickness of the spring is increased in proportion to the increase in spring length.

A further advantage of a corrugated spring is that the bending moment experienced by the spring base for a given force applied at the spring tip is reduced proportionally to the reduction of projected length "$L_p$." Reducing the bending moment at the base reduces the spring base area required to achieve adequate adhesion of the spring structure to the substrate. A reduced base area, in turn, further reduces the footprint of the spring structure. Additionally, corrugations provide resiliency in the horizontal plane, parallel to the substrate (i.e., in the "x-y plane"). That is, corrugated springs can be made more mechanically compliant in the x-y plane than straight and convex designs. This is advantageous where the spring tip will be fixed in place (e.g., if the spring tip must be soldered down to the contact pad). The resiliency in the x-y plane compensates for thermal expansion differentials, misalignment, vibration and other stresses between connected components, thereby increasing the reliability of the connection.

Different types of contours may be combined on a single spring. For example, a combination of contouring along a beam length and across its width is described above. Similarly, a corrugated beam may be provided with other contoured features, such as the central rib 69 shown on the corrugated beam 68 in FIG. 10, provided to stiffen the spring structure. Alternatively, or in addition, a corrugated beam may be provided with a a further lengthwise curvature, such as the compound curve 34 shown in FIGS. 1B and 7B. A corrugated beam may also be contoured across its width, for example, to provide a V-shaped cross-section as shown in FIG. 5A, or a U-shaped cross-section as shown in FIG. 5B.

As previously described, for many applications it is advantageous to taper the beam of a microelectronic spring structure across its width, thereby creating a triangular shape in plan view. Triangular beam shapes are more structurally efficient, although less efficient in conducting electrical current, than untapered, rectangular beam shapes. Similar considerations apply to beams that are tapered in thickness, from a maximum thickness at the base of a spring beam to a minimum thickness at the beam tip. Tapering the thickness provides a proportionally much greater stiffening effect than tapering the width, because the area moment of inertia "I" of a cantilevered beam section is proportional to the cube of the section thickness, but is only linearly related to the section width. However, on a lithographic type, it is more difficult to taper the beam thickness than it is to taper the beam width. Typical lithographic processes for depositing beam material, such as electroplating and sputtering, tend to deposit material in layers of essentially uniform thickness. In comparison, the width of a lithographic structure is easily controlled using methods known in the art, such as masking.

Figure 11A:
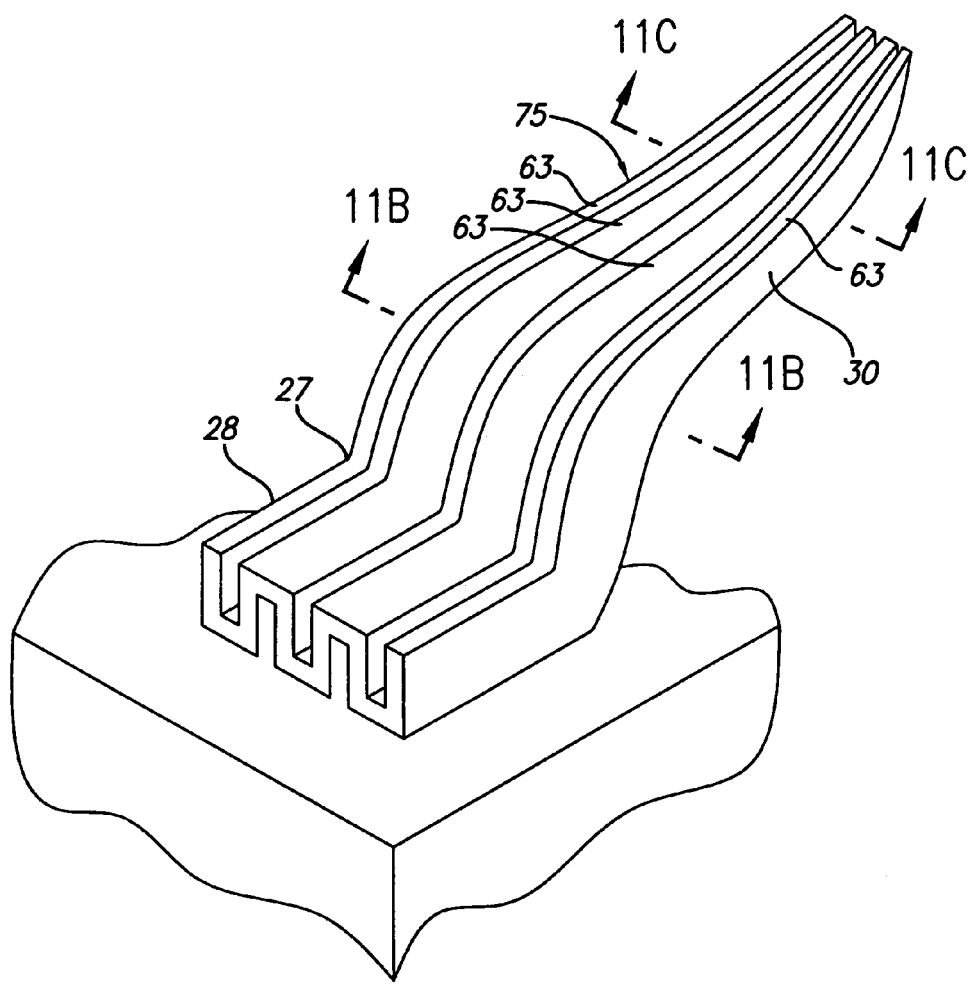
FIG. 11A is a perspective view of a contoured spring having a plurality of longitudinal ribs of tapering thickness.
Figure 11B:
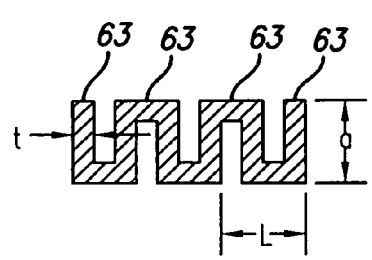
FIGS. 11B and 11C are cross-sectional views of the contoured spring shown in FIG. 11A.
Figure 11C:
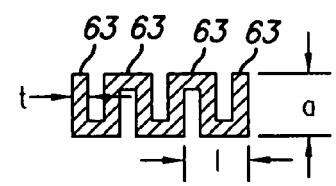

The present invention provides beams of tapered thickness by providing a plurality of narrowly spaced ribs that taper from a relatively high profile at the base, to a relatively narrow profile at the tip of the beam. Such beams are of essentially of uniform thickness, and so can be formed by conventional techniques for material deposition, such as electroplating. Because of the large number of ribs, the beam performs like a beam with a tapered thickness. An exemplary spring structure with a plurality of closely spaced ribs is shown in FIGS. 11A–11C. Spring structure 75 is provided with a plurality of ribs 63 extending into base 28, similarly to the spring structure shown in FIG. 7A. Extending the ribs into base 28 stiffens the structure 75 at juncture 27, but reduces adhesion of base 28 to substrate 23. In the alternative, the ribs may be terminated at the juncture 27 between the beam 30 and base 28, similar to the structure shown in FIG. 8. This configuration maximizes electrical contact with and adhesion to the substrate 23, but results in stress concentration between beam 30 and base 28 at juncture 27. In the alternative, the ribs may be extended partially into the base, combining the benefits of both approaches. It is evident that such as structure may be formed on a lithographic type by depositing a material in a contoured, open mold, as previously described.

As shown in FIGS. 11B and 11C, ribs 63 provide an apparent beam thickness "a" equal to the height of the ribs. The apparent beam thickness "a" provides an effective thickness depending on the distance "I" between each rib and the material thickness "t." At a first cross-section taken near base 28, shown in FIG. 11B, ribs 63 are relatively high, but not as closely spaced are near the tip 26. As exemplified by a second cross-section taken closer to the tip 26, shown in FIG. 11C, the ribs are more closely spaced as they converge near the tip. The material thickness "t" is essentially uniform throughout the length of the beam. In alternative embodiments, the ribs do not converge. Instead, if the beam 30 is tapered, the number of ribs across the width of the beam 30 decreases towards the tip.

Figures 12A, 12B:
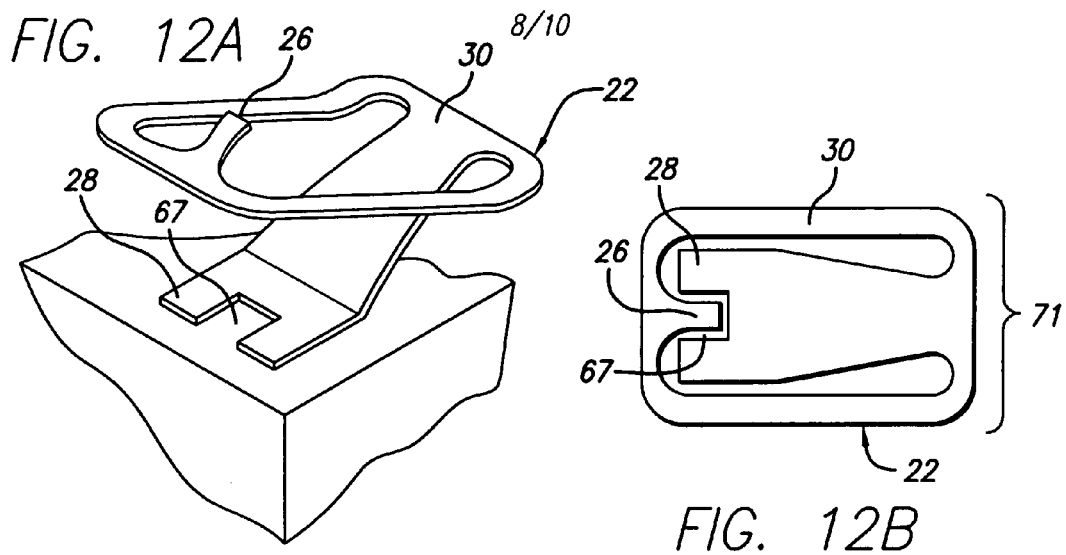
FIG. 12A is a perspective view of an x-y folded design for a spring structure, having a split beam.
FIG. 12B is a plan view of the spring structure of FIG. 12A.

Contouring may be additionally provided in the x-y plane, to create non-linear, beams that have a portion offset from a straight line between the spring base and tip. Offset structures are useful for forming low base moment, torsional beams. An exemplary non-linear offset spring structure for reducing the bending moment on the base is illustrated in FIGS. 12A and 12B. Beam 30 is split into two arms which are routed back towards and over the base 28. Tip 26 is preferably disposed over base 28 when viewed in plan view as shown in FIG. 12B. To allow for forming of the entire structure 22 in a deposition process over a sacrificial mold, base 28 is optionally provided with a cut-out 67 to provide space for formation of tip 26. In the alternative, no cut-out 67 is formed in base 28, and tip 26 is not disposed directly over the base 28, but instead is disposed closely over it.

The split-arm, non-linear structure shown in FIGS. 12A and 12B provides several advantages. The non-linear configuration allows for positioning the tip 26 directly over base 28 (or nearly so) and thereby greatly reduces the bending moment imposed on base 28 by a vertical contact force on the tip 26. Because of the reduction or elimination of bending moment, the area of base 28 can be reduced in size without fear of causing the spring structure to become unattached from substrate 23. Another advantage in that the effective length of the spring structure is increased for a given footprint, as previously described with respect to corrugated beam springs. Thus, elastic range "c" of the spring is increased compared to a shorter spring with the same footprint, provided the ratio t/L is the same. Additionally, beam 30 may be designed for torsion in the transition area 71 where the split arms meet the central beam at a right angle, providing further opportunities for fine-tuning the performance characteristics of the spring structure by building appropriate sectional properties in the transition area. As is evident from FIG. 12B, the entire spring structure may be formed by deposition of spring material in an open mold. It should further be apparent that the x-y contoured shape may be combined with the other types of contoured shapes, such as ribs, thickness tapers, and contoured cross-sections.

Another example of a non-linear, offset contoured spring is shown in FIGS. 13A and 13B. This example is C-shaped in plan view, as shown in FIG. 13B, and has a single beam 30 extending back towards and above base 28. Unlike the spring structure shown in FIG. 12A, this single-beam structure has its tip 26 disposed a distance $L_p$ from the centroid of base 28. Thus, this design greatly reduces, but does not eliminate, the bending moment on base 28. Of course, if desired, the tip could be routed over the base in a manner similar to the non-linear spring shown in FIG. 12A.

Figures 14A, 14B:
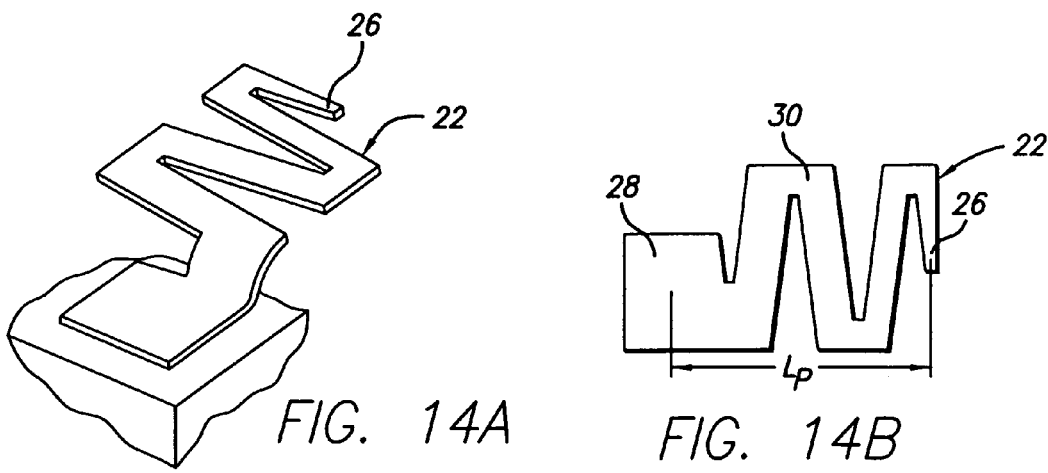
FIG. 14A is a perspective view of an alternative x-y folded design for a spring structure, having a serpentine beam.
FIG. 14B is a plan view of the spring structure of FIG. 14A.

Yet another example of a non-linear, offset contoured spring is shown in FIGS. 14A and 14B, showing a spring structure which is serpentine in plan view. In this example, the tip 26 is not routed back towards the base 28, although a serpentine spring could be so routed, if desired. However, it is evident from FIG. 14B that the ratio of the beam span $L_p$ to the integrated beam length L is substantially less than one, so the moment on base 28 is correspondingly reduced. A serpentine spring has the advantage of providing a relatively long integrated beam length in a compact footprint. Also, in a serpentine spring, torsional stress is distributed among the numerous bends of the serpentine structure, rather than being concentrated in a single bend. It should be understood from the foregoing examples that a great variety of different offset, x-y contoured shapes are possible without departing from the scope of the present invention.

Figure 15A:
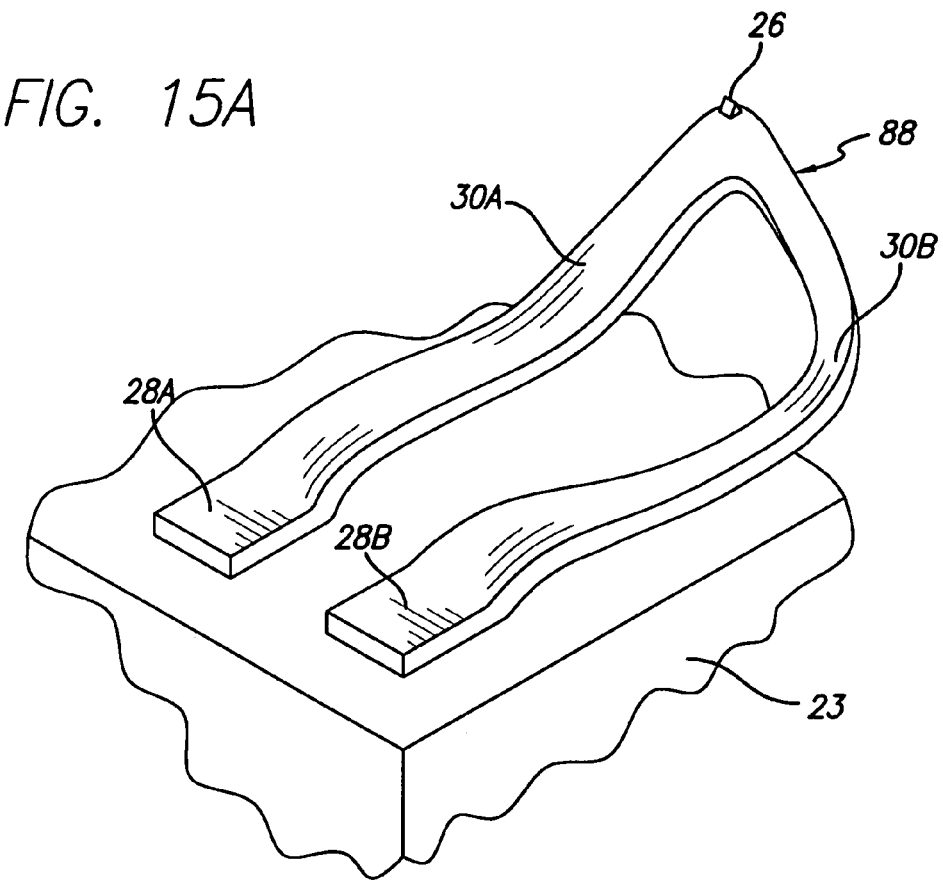
FIG. 15 is a perspective view of a spring structure for connecting to multiple contact pads, for providing split inputs for tuned devices.
Figure 15B:
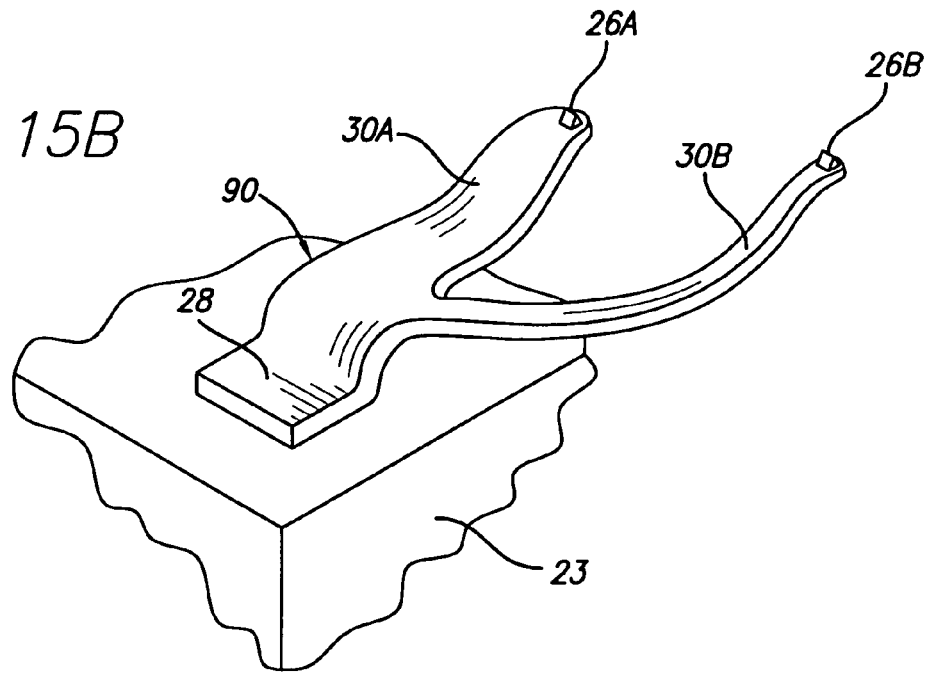

FIGS. 15A and 15B show alternative embodiments of the invention for making contact between a single contact pad on a first device and between two or more contact pads on a second device. FIG. 15A shows a forked, bi-based structure 88, and FIG. 15B shows a forked, dual-tipped structure 90. Spring contacts 88 and 90 are both provided with dual beams 30A and 30B. In bi-based structure 88, beams 30A and 30B are joined at tip 26, and lead to respective ones of separate bases 28A and 28B. In dual-tipped structure 90, beams 30A and 30B diverge from base 28 to respective ones of the dual tips 26A and 26B. As exemplified by both of structures 88 and 90, the dimensions (length and width) of the plural beams in a forked contact structure are independently controllable. For example, first beam 30A is shorter and wider than second beam 30B in both structures 88 and 90. It will be apparent that forked structures having any number of interconnected and independent beams between plural bases and tips may readily by formed using the lithographic processes described and referenced herein.

Multiple beams, such as dual beams 30A and 30B, can be used to tune interconnect system frequency response in the same way as a bond wire. Independent control of the dimensions of each beam in a forked structure, and of the geometric relationship between the beams provides control of the inductance of the each beam, and of their mutual inductance. Fabrication of such structures using a lithographic process permits control of inductance with a high degree of precision. Thus, desired characteristics of the frequency response of an interconnect system, such as passband width or flatness, can be accurately tuned using structures such as structures 88 and 90.

Microelectronic spring structures according to the present invention may be used in various modes for making electrical connections between electronic components. In one embodiment, a spring structure is used to make a reversible connection between its tip and a contact pad of another electronic component, such as a printed circuit board (PCB). In this mode, the contact structure is preferably not deformed past its elastic range, so it may be repeatedly reused in its original configuration. As known in the art, conducting liquids may also be used for making or enhancing an electrical connection by depositing them on one or both of the spring tip and mating contact pad. Suitable liquids might include low-melting-point elemental metals such as gallium or mercury, metal alloys such as New-Merc™ (a low-vapor-pressure mercury replacement material), and oil or grease filled with conductive particles such as carbon black. In another embodiment, a contact structure according to the present invention is used to more permanently join, such as with solder, its tip to a contact pad of another electronic component. In this case, the contact structures should react compliantly in the "x-axis" and/or "y-axis", to accommodate differences in thermal expansion coefficients between two electronic components.

In the case of contact structure used in a resilient, reversible mode, electrical performance can be enhanced by adding specialized tip components. Co-pending, commonly assigned U.S. patent application Ser. No. 08/819,464, entitled "CONTACT TIP STRUCTURES FOR MICROELECTRONIC INTERCONNECTION ELEMENTS AND METHODS OF MAKING SAME", and corresponding PCT application Ser. No. PCT/US97/08606, published Nov. 20, 1997 as WO97/43653, both of which are incorporated herein by reference, describe a method for defining a tip structure on a sacrificial substrate and transferring that structure to an microelectronic spring structure. It should be apparent that such methods may be adapted for use with the present invention. Examples of contact tips for use with microelectronic spring structures according to the present invention are provided in FIGS. 16A–16E.

Figure 16A:
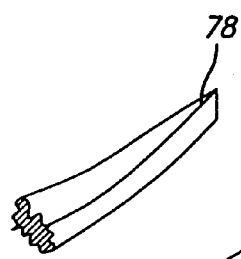
FIG. 16A is a perspective view of an exemplary pointed contact tip of a spring structure.
Figure 16B:
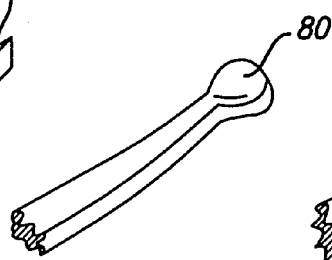
FIG. 16B is a perspective view of an exemplary spherical contact tip of a spring structure.
Figure 16C:
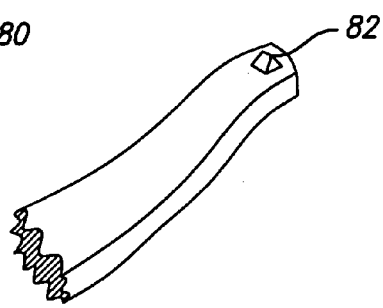
FIG. 16C is a perspective view of an exemplary pyramidal contact tip of a spring structure.
Figure 16E:
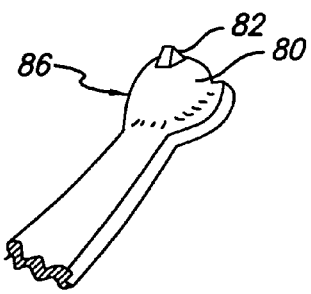
FIG. 16E is a perspective view of an exemplary serial combination contact tip of a spring structure, having both pyramidal and spherical aspects.
Figure 16D:
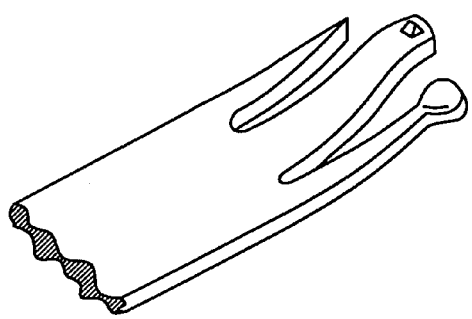
FIG. 16D is a perspective view of an exemplary parallel combination contact tip of a spring structure, including pointed, spherical, and pyramidal contact tips.

FIG. 16A shows an integral pointed tip structure. FIG. 16B shows a spherical integral tip, which is preferable for making more permanent connections. Various shapes of integral tips may be provided on a microelectronic spring structure according to the present invention, by providing a complementary mold shape in the layer of sacrificial mold material. For example, a spherical tip may be formed by providing a hemispherical shape in the sacrificial layer at an appropriate position. Integral tips, whether pointed, spherical, or some other shape, provide the advantages of simplicity and lower cost, because they can be integrally formed with the beam of the spring structure, thus avoiding the need for additional process steps. However, they have the disadvantage of limiting the choice of materials and shapes for the conductive tip. The resilient spring material (such as a nickel alloy) and/or a conductive metal (such as gold) plated thereon is usually not the best choice for tip material. For many applications, a harder and sharper structure is desired, for cutting through layers of oxide and contamination on the surface of a contact pad. For some applications, such as for contacting C4 solder balls, a pyramidal tip of a harder material is better suited, as shown in FIG. 16C. Pyramidal tips are preferably formed in an independent operation, and adhered to the tip end of a beam, as further described in the previously referenced, co-pending U.S. patent application Ser. No. 08/819,464. Suitable material for a pyramidal tip includes, for example, palladium-cobalt alloy, tungsten, nickel alloys, diamond, and diamond dust composites. The pyramidal tip is preferably plated with a conducting layer, such as soft gold, after being adhered to the tip end of a beam. Multiple pyramidal tips may be used, and geometric shapes other than pyramids may be used, so long as sufficiently abrasive to cut through layers of oxide and contamination on the surface of a contact pad. For example, a plurality of randomly-shaped abrasive particles, such as diamond dust with an average particle diameter of less than about 10 μm, may be adhered to a spherical tip about 100 μm in diameter, and plated with a conducting metal.

In an embodiment of the invention, different tip structures are combined for the purpose of redundancy, or to serve in multi-purpose applications. For example, a pointed tip, a pyramidal tip, and a spherical tip may be combined in parallel as in the parallel combination tip 84 shown in FIG. 16D. Perhaps more typically, a similar parallel tip structure may be used, wherein each of the parallel tips is the same type, and the primary purpose for the redundant tips is increased reliability. In a combination tip structure the contact structure is also improved for use with a wider range of applications. For example, the pyramidal tip 82 shown in FIG. 16D could be used to make repeatable connections during a testing phase of an integrated circuit, and spherical tip 80 would be used to make a long term connection for the same circuit, such as to a printed circuit board of an electronic component. Pointed tip 78 could serve as a general purpose, redundant tip, in case one of tips 80 or 82 is damaged. In the alternative, one of the tips, such as tip 78, could be omitted. Similar benefits may be achieved by combining different types of tips in series, as in the serial combination tip shown in FIG. 16E. Serial combination tip 86 comprises a pyramidal tip 82 mounted to an integrally formed spherical tip 80. Thus, the same combination tip 86 is suited for both repeated, short term connections with pyramidal tip 82, and for long term connections, using spherical tip 80.

It should be understood that it is preferable to select from, and combine in various ways, the structures described and exemplified above, depending on the specific requirements of a particular microelectronics contact application. For example, a single substrate may be provided with different types of springs, for example, relatively large structures for providing power and ground connections, smaller structures for transmission of digital signals, and forked structures for tuning. Additionally, an application may have requirements that can be satisfied by two or more shapes or structures according to the present invention, of which no single shape is inherently superior. Furthermore, structures according the present invention are not limited to use on integrated circuit substrates, but may also be used in other applications, such as sockets or connectors. In general, the shape contouring provided by the present invention provides versatile design solutions for mass-producible spring contacts at a scale far smaller than has heretofore been achieved, thereby opening up a wide range of potential applications for such devices.

Having thus described a preferred embodiment of a microelectronic spring structure, it should be apparent to those skilled in the art that certain advantages of the within system have been achieved. It should also be appreciated that various modifications, adaptations, and alternative embodiments thereof may be made within the scope and spirit of the present invention. For example, a microelectronic spring structure for making electrical connections to semiconductor devices has been illustrated, but it should be apparent that the inventive concepts described above would be equally applicable to a lithographic type spring structure used as a non-electrically-conducting mechanical spring. For further example, specific contoured shapes have been disclosed herein, but it should be apparent that the inventive concepts described above would be equally applicable to shape variations made thereon, and to alternative contoured shapes suitable for lithographic type, integrally formed microelectronic spring structures. The invention is further defined by the following claims.

What is claimed is:

1. A microelectronic spring structure comprising:
   a base secured to a terminal of an electronic component, wherein said electronic component comprises a semiconductor die; and
   a beam extending from said base and ending in a tip spaced from said electronic component, wherein a shape of a cross-sectional width of said beam perpendicular to a length of said beam from said base to said tip comprises a contour that increases at least one of an area moment of inertia of said beam, a stiffness of said beam, and a spring force of said beam relative to a beam having an equivalent mass per unit length but lacking said contour,
   wherein a thickness of said beam is thinner at said tip than at said base.

2. The microelectronic spring structure of claim 1, wherein said semiconductor die is one of a plurality of semiconductor dice composing an unsingulated semiconductor wafer.

3. The microelectronic spring structure of claim 2, wherein an end said tip of said beam has an unloaded height over said electronic component in the range of about 1 to about 5 mils.

4. The microelectronic spring structure of claim 2, wherein an end said tip of said beam has an unloaded height over said electronic component less than about 2 mils.

5. The microelectronic spring structure of claim 2, wherein said beam has a width in the range of about 6 to about 12 mils.

6. The microelectronic spring structure of claim 2, wherein said beam has a width no greater than about 5 mils at said base.

7. The microelectronic spring structure of claim 6, wherein said beam has a width less than about 1 mil.

8. The microelectronic spring structure of claim 2, wherein said length of said beam is in the range of about 1 to about 10 mils.

9. The microelectronic spring structure of claim 2, wherein said microelectronic spring structure has an elastic deflection ratio in a direction perpendicular to and towards said electronic component of at least about 10%.

10. The microelectronic spring structure of claim 2, wherein said microelectronic spring structure has an elastic range in a direction perpendicular to and towards said electronic component within a range of about one to about twenty mils.

11. The microelectronic spring structure of claim 2, wherein said microelectronic spring structure has a spring rate at an end thereof in at least one direction within a range of about 30 to about 600 micrograms per micron.

12. The microelectronic spring structure of claim 1, wherein said beam is contoured in a lengthwise direction.

13. The microelectronic spring structure of claim 1, wherein said cross-sectional width is generally V-shaped.

14. The microelectronic spring structure of claim 1, wherein said cross-sectional width is generally U-shaped in cross-section.

15. The microelectronic spring structure of claim 1, wherein said cross-sectional width is generally S-shaped in a lengthwise direction.

16. The microelectronic spring structure of claim 1, wherein said beam further comprises corrugations disposed along a lengthwise direction.

17. The microelectronic spring structure of claim 1, wherein said beam, in a lengthwise sectional view, has a stepped portion connected to said base.

18. The microelectronic spring structure of claim 17, wherein said stepped portion of said beam has a step height in the range about 5% to about 20% of an unloaded height of an end of said beam over said electronic component.

19. The electronic component of claim 17, wherein said stepped portion of said beam has a step height about 10% of an unloaded height of an end of said beam over said electronic component.

20. The microelectronic spring structure of claim 1, wherein said beam further comprises a plurality of lengthwise ribs extending over at least a portion of said beam.

21. The microelectronic spring structure of claim 1, wherein said beam further comprises a plurality of lengthwise ribs extending over at least a portion of said beam.

22. The microelectronic spring structure of claim 21, wherein said beam has a stepped portion connected to said base, and wherein said lengthwise rib extends to said stepped portion.

23. The microelectronic spring structure of claim 21, wherein said lengthwise rib extends into said base.

24. The microelectronic spring structure of claim 21, wherein said lengthwise rib comprises a lengthwise channel.

25. The microelectronic spring structure of claim 21, wherein said lengthwise channel has a regular geometric cross-sectional shape.

26. The microelectronic spring structure of claim 25, wherein said regular geometric cross-sectional shape further comprises a shape selected from the group consisting of part-rectangular, part-trapezoidal, part-triangular and part-round shapes.

27. The microelectronic spring structure of claim 21, wherein a cross-sectional dimension of said lengthwise rib differs over the length thereof.

28. The microelectronic spring structure of claim 21, wherein said rib is comprised of a folded portion of said beam.

29. The microelectronic spring structure of claim 1, wherein said beam has a plurality of ribs along a lengthwise direction, wherein said plurality of ribs have a height tapering from a first dimension at said base to a second dimension at said tip, wherein said first dimension is greater than said second dimension.

30. The microelectronic spring structure of claim 1, wherein said base and said beam are integrally formed.

31. The microelectronic spring structure of claim 1, wherein said beam, viewed in a direction normal to said electronic component, is tapered so as to have a generally triangular shape.

32. The microelectronic spring structure of claim 1, wherein said beam, viewed in a direction normal to said electronic component, has a generally rectangular shape.

33. The microelectronic spring structure of claim 1, wherein said beam, viewed in a direction normal to said electronic component, has an offset with respect to a central axis.

34. The microelectronic spring structure of claim 1, wherein said beam, viewed in a direction normal to said electronic component, is contoured so that said tip is located at an end of said beam and is opposite said base is positioned a distance from said base that is less than an integrated length of said beam between said base and said tip.

35. The microelectronic spring structure of claim 1, wherein said beam, viewed in a direction normal to said electronic component, is serpentine.

36. The microelectronic spring structure of claim 1, wherein said beam, viewed in a direction normal to said electronic component, is C-shaped.

37. The microelectronic spring structure of claim 34, wherein a portion of said beam comprises at least two parallel arms.

38. The microelectronic spring structure of claim 1, wherein said base and said beam are integrally formed and comprise a resilient material.

39. The microelectronic spring structure of claim 1, wherein said base and said beam are integrally formed and comprise a layer of an electrically conductive seed material and a layer of metallic material electroplated onto said seed material, wherein said layer of metallic material is thicker than said layer of seed material.

40. An electronic component comprising:
a terminal; and
a contact structure comprising:
a base secured to said terminal; and
a beam extending from said base and ending in a tip spaced from said electronic component, a cross-sectional width of said beam perpendicular to a length of said beam from said base to said tip comprising one of a "V" shape, a "U" shape, and a shape comprising an extension that forms a rib, wherein a thickness of said beam is thinner at said tip than at said base,
said beam comprises a compound curve along said length from said base to said tip, and said electronic component is a semiconductor die.

41. The electronic component of claim 40, wherein said semiconductor die is one of a plurality of semiconductor dice composing an unsingulated semiconductor wafer.

42. The electronic component of claim 40, wherein said beam is contoured along a length thereof.

43. The electronic component of claim 40, wherein said beam has a generally triangular shape.

44. The electronic component of claim 40, wherein said base and said beam are integrally formed.

45. The electronic component of claim 44, wherein said base and said beam comprise a resilient material.

46. The electronic component of claim 44, wherein said base and said beam comprise a layer of conductive seed material and a layer of metallic material electroplated onto said seed material, wherein said layer of metallic material is thicker than said layer of seed material.

47. The electronic component of claim 40 further comprising a plurality of said terminals and a plurality of said contact structures.

48. The electronic component of claim 40, wherein said cross-sectional width of said beam is contoured in said "V" shape.

49. The electronic component of claim 40, wherein said cross-sectional width of said beam is contoured in said "U" shape.

50. The electronic component of claim 40, wherein said cross-sectional width of said beam is contoured in said shape comprising an extension that forms a rib.

51. The microelectronic spring structure of claim 1, wherein said contour increases said area moment of inertia of said beam.

52. The microelectronic spring structure of claim 1, wherein said contour increases said stiffness of said beam.

53. The microelectronic spring structure of claim 1, wherein said contour increases said spring force of said beam.

54. The microelectronic spring structure of claim 1, wherein said contour is non-rectangular.

55. The microelectronic spring structure of claim 54, wherein said contour increases a spring force of said beam relative to a beam having an equivalent mass per unit length having a rectangular contour.

56. The microelectronic spring structure of claim 1, wherein said base and said beam are integrally formed one with another and comprise a single structure.

57. The microelectronic spring structure of claim 56, wherein said single structure comprises lithographically deposited material.

58. The microelectronic spring structure of claim 1, wherein said base and said beam compose a single structure comprising electroplated material.

59. An semiconductor die comprising:
a terminal disposed on said semiconductor die and providing signal input and/or output to said semiconductor die; and
an electrically conductive contact structure having two ends, wherein:
a first of said ends comprises a base secured to said terminal,
a beam portion of said contact structure extends away from said semiconductor die and terminates in a second of said ends, and
a geometric shape of a cross-sectional width of said beam is asymmetrical with respect to an axis about which a mass distribution of said beam at said cross-sectional width is symmetrically distributed,
wherein said cross-sectional width is perpendicular to a length of said beam from said first end to said second end.

60. The electronic component of claim 59, wherein said shape is "V" shaped.

61. The electronic component of claim 59, wherein said shape is "U" shaped.

62. The electronic component of claim 59, wherein said shape comprises an extended portion forming a rib.

63. The electronic component of claim 59, wherein said shape comprises an arc.

64. The electronic component of claim 59, wherein said shape comprises two convex arcs joined one to another.

65. The electronic component of claim 59, wherein said contact structure comprises an integrally formed, single structure.

66. The electronic component of claim 65, wherein said contact structure comprises lithographically deposited material.

67. The electronic component of claim 59, wherein said contact structure comprises electroplated material.

68. The electronic component of claim 59, wherein said shape increases at least one of an area moment of inertia of said beam, a stiffness of said beam, and a spring force of said beam relative to a beam having an equivalent mass per unit length but lacking said shape.

69. The electronic component of claim 68, wherein said shape increases said area moment of inertia of said beam.

70. The electronic component of claim 68, wherein said shape increases said stiffness of said beam.

71. The electronic component of claim 68, wherein said shape increases said spring force of said beam.

72. The electronic component of claim 59, wherein said electronic component comprises a semiconductor die.

73. The electronic component of claim 72, wherein said die is one of a plurality of dies of an unsingulated semiconductor wafer.

74. The microelectronic spring structure of claim 1, wherein said thickness of said beam tapers continuously from said base to said tip.

75. The microelectronic spring structure of claim 1, wherein said beam comprises a compound curve along said length from said base to said tip.

76. The microelectronic spring structure of claim 1, wherein continuously along said length of said beam from said base to said tip a cross-sectional width of said beam comprises a contour that increases at least one of an area moment of inertia of said beam, a stiffness of said beam, and a spring force of said beam relative to a beam having an equivalent mass per unit length but lacking said contour.

77. The microelectronic spring structure of claim 1, wherein said thickness of said beam is generally along a direction in which said beam deflects in response to a force applied to said tip.

78. The electronic component of claim 40, wherein said thickness of said beam tapers continuously from said base to said tip.

79. The electronic component of claim 40, wherein said beam comprises a compound curve along said length from said base to said tip.

80. The electronic component of claim 40, wherein continuously along said length of said beam from said base to said tip a cross-sectional width of said beam comprises one of a ""V" shape, a "U" shape, and a shape comprising an extension that forms a rib.

81. The electronic component of claim 40, wherein said thickness of said beam is generally along a direction in which said beam deflects in response to a force applied to said tip.

82. The electronic component of claim 59, wherein said second end comprises a contact tip configured to contact another electronic component.

83. The electronic component of claim 82, wherein:
said beam is configured to deflect from an initial position in response to a force applied to said tip, wherein said beam is in said initial position prior to said force being applied to said tip, and
said geometric shape of a cross-sectional width of said beam is asymmetrical with respect to an axis about which a mass distribution of said beam at said cross-sectional width is symmetrically distributed while said beam is in said initial position.

84. The electronic component of claim 82, wherein a thickness of said beam is thinner at said tip than at said base.

85. The electronic component of claim 84, wherein said thickness of said beam tapers continuously from said base to said tip.

86. The electronic component of claim 82, wherein said thickness of said beam is generally along a direction in which said beam deflects in response to a force applied to said tip.

87. The electronic component of claim 59, wherein said beam comprises a compound curve along said length from said base to said tip.

88. The electronic component of claim 59, wherein continuously along said length of said beam from said base to said tip a geometric shape of a cross-sectional width of said beam is asymmetrical with respect to an axis about which a mass distribution of said beam at said cross-sectional width is symmetrically distributed.

* * * * *